United States Patent
Odagiri

(10) Patent No.: US 8,860,523 B2
(45) Date of Patent: Oct. 14, 2014

(54) PULSE WIDTH MODULATION CIRCUIT AND VOLTAGE-FEEDBACK CLASS-D AMPLIFIER CIRCUIT

(75) Inventor: Naoya Odagiri, Itami (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 358 days.

(21) Appl. No.: 13/348,448

(22) Filed: Jan. 11, 2012

(65) Prior Publication Data

US 2012/0105155 A1    May 3, 2012

Related U.S. Application Data

(63) Continuation of application No. 12/794,156, filed on Jun. 4, 2010, now Pat. No. 8,115,563.

(30) Foreign Application Priority Data

Jun. 22, 2009   (JP) .................................. 2009-147640

(51) Int. Cl.
*H03K 7/08*     (2006.01)
*H03K 4/06*     (2006.01)
*H03K 3/017*    (2006.01)
*H03F 3/217*    (2006.01)

(52) U.S. Cl.
CPC ................. *H03F 3/217* (2013.01); *H03K 7/08* (2013.01); *H03K 3/017* (2013.01); *H03K 4/06* (2013.01); *H03F 3/2178* (2013.01); *H03F 3/2171* (2013.01)
USPC ........... 332/109; 327/134; 327/175; 327/176; 330/251; 363/21.11; 375/238

(58) Field of Classification Search
CPC ............ H03C 2200/0045; H03F 3/217; H03F 3/2171; H03F 3/2173; H03F 3/2178; H03K 3/017; H03K 4/06; H03K 7/08
USPC .............. 327/131–140, 172–177; 330/207 A, 330/251; 332/109–111; 363/21.1, 21.11, 363/26, 41, 42; 375/238
See application file for complete search history.

(56) References Cited

U.S. PATENT DOCUMENTS 3,970,916 A * 7/1976 Kienscherf .................... 363/71
4,949,048 A * 8/1990 Tokumo et al. ................ 330/10

(Continued)

FOREIGN PATENT DOCUMENTS

| JP | 62-031375 A | 2/1987 |
| JP | 2001-145368 A | 5/2001 |

(Continued)

OTHER PUBLICATIONS

Japanese Office Action issued in Japanese Application No. 2009-147640 dated Jun. 11, 2013 with English Translation.

*Primary Examiner* — Levi Gannon
(74) *Attorney, Agent, or Firm* — McDermott Will & Emery LLP

(57) ABSTRACT

The frequency characteristic of a voltage-feedback class-D amplifier circuit for driving an output load is improved. A triangular-wave correction circuit which compensates a gradient of a triangular wave is provided to a triangular-wave signal generator which supplies a triangular wave signal used as a PWM carrier to a comparison circuit for performing PWM modulation of an input signal. In an area where a duty of a command value for an output circuit drive becomes about 50%, a slew rate (gradient) of the triangular wave is decreased.

2 Claims, 20 Drawing Sheets

(56) References Cited

U.S. PATENT DOCUMENTS

| | | |
|---|---|---|
| 5,113,158 A | 5/1992 | Tsuji et al. |
| 5,815,581 A * | 9/1998 | Andersson .................... 381/321 |
| 6,078,214 A * | 6/2000 | Zhang ............................. 330/10 |
| 6,339,360 B1 * | 1/2002 | Santillano ....................... 330/10 |
| 7,230,485 B2 * | 6/2007 | De Cremoux et al. ........ 330/251 |
| 7,332,962 B2 * | 2/2008 | Wu et al. ....................... 330/251 |
| 7,439,779 B2 | 10/2008 | Okamoto et al. |
| 8,203,382 B2 * | 6/2012 | Maeda .......................... 330/251 |
| 8,288,953 B1 * | 10/2012 | Mei ........................... 315/209 R |
| 8,368,475 B2 * | 2/2013 | Nakada et al. ................ 331/111 |
| 2007/0279127 A1 * | 12/2007 | Lee ................................. 330/10 |

FOREIGN PATENT DOCUMENTS

| | | |
|---|---|---|
| JP | 2001-268977 | 9/2001 |
| JP | 2004-312606 | 11/2004 |
| JP | 2005-160146 A | 6/2005 |

* cited by examiner

S1:

S2:

: DEAD-OFF PERIOD

S3:

S4:

: DEAD-OFF PERIOD

S5:

S6:

: DEAD-OFF PERIOD

S7:

S8:

: DEAD-OFF PERIOD

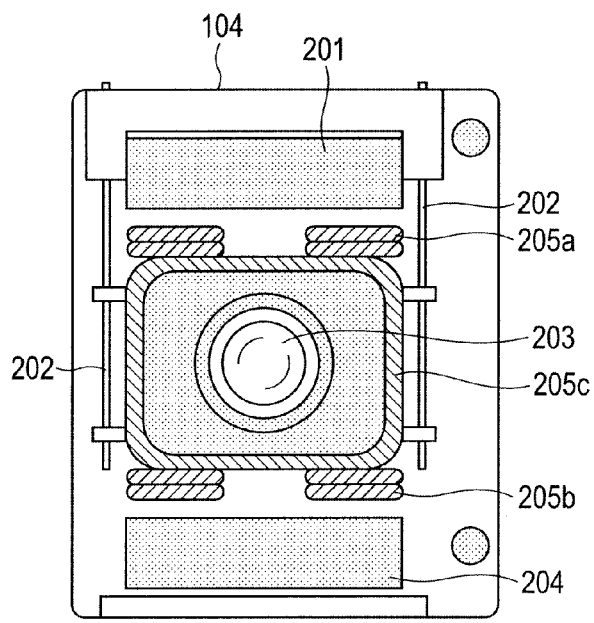 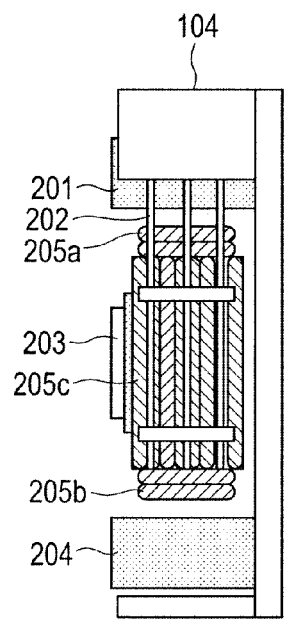
FIG. 21A  FIG. 21B
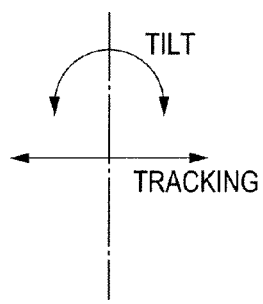 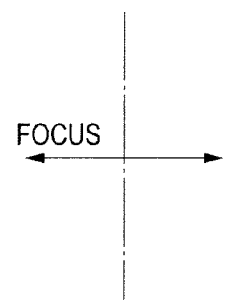

PULSE WIDTH MODULATION CIRCUIT AND VOLTAGE-FEEDBACK CLASS-D AMPLIFIER CIRCUIT

CROSS REFERENCE TO RELATED APPLICATIONS

This application is a Continuation of U.S. application Ser. No. 12/794,156, filed on Jun. 4, 2010, now U.S. Pat. No. 8,115,563 which claims priority of Japanese Patent Application No. 2009-147640, filed on Jun. 22, 2009, the entire contents of each of which are hereby incorporated by reference.

BACKGROUND OF THE INVENTION

The present invention relates to a pulse width modulation circuit and a voltage-feedback class-D amplifier circuit using the same, especially, relates to configuration for improving the frequency characteristic of a circuit part which performs pulse width modulation by comparing an input signal with a triangular wave.

In AV (audio/visual) equipment etc., a portion for driving a load performs internal signal processing in digital, and an amplifier is employed when a load such as a motor and an actuator is driven by generating an output signal corresponding to an input signal. Generally, a digital amplifier is used for such an amplifier.

The amplification system of the digital amplifier is a class D amplifier system. In the digital amplifier, an input signal is compared in level with a triangular wave generated inside, and a signal is generated according to the comparison result; accordingly, the input signal is transformed into a pulse-width-modulated signal (PWM signal). A switching transistor of an output stage is driven according to the PWM signal, and the switching transistor of the output stage will be in ON and OFF states (conduction and non-conduction states) for a period corresponding to the pulse width. Accordingly, a signal corresponding to the input signal is generated at the output. The digital amplifier (class D amplifier) carries out only switching operation of the output stage transistor between ON and OFF states; therefore, the digital amplifier is excellent in power efficiency.

In the class D amplifier (digital amplifier), an output signal having ternary values of a positive value, a negative value, and 0 (zero) is generated according to an input signal. Here, the output signal indicates a difference signal of a voltage PO(+) and a voltage PO(−) which are applied to both ends of a load. When amplitude of the input signal is small, the positive voltage PO(+) and the negative voltage PO(−) become almost equal, and the output signal (PO(+)−PO(−)) becomes nearly 0V, accordingly, almost no current flows through the load.

In driving the load, in order to avoid influence of an induced current resulting from an inductance component of the load, and in order to prevent a high-side power source node and a low-side power source node from short-circuiting, a dead time is provided to set an output switching transistor to OFF state. In the dead time, an output switching transistor in ON state is turned to OFF state, then after the dead time, the following output switching transistor is driven to ON state.

Interdependently affected by the dead time, at the time of inputting a small amplitude signal, a so-called PWM dead zone appears, in which it becomes difficult to generate a PWM signal as a signal to drive an output switching transistor.

Patent Document 1 and Patent Document 2 disclose configuration which aims at improvement of linearity and a frequency response to a command signal, by eliminating such a dead zone due to a dead time.

In Patent Document 1, plural kinds of triangular-wave signals which are offset (level-shifted) in the positive and the negative direction are generated. After determining the polarity of an input signal, one of the plural triangular-wave signals which are offset is chosen and sent to a comparison circuit. The comparison circuit is provided corresponding to each of switching transistors arranged in a full bridge configuration. The comparison circuit compares an input signal with a triangular-wave signal which is individually assigned and offset, and provides a switching control signal based on a command signal to the corresponding transistor according to the comparison result.

By offsetting (level-shifting) triangular-wave signals, Patent Document 1 aims at fully securing a dead time and an "ON" period of a switching control signal and accordingly eliminating the dead zone of a PWM signal, even in a case where the command signal changes in the vicinity of 0V.

In the configuration disclosed by Patent Document 2, a mixed input audio signal is generated by mixing a distortion correcting signal to an input audio signal. Even when the amplitude of the input audio signal is small, it is possible to generate a PWM signal by making a level comparison to a triangular-wave signal with the use of the distortion correcting signal. A PWM signal for switching control is generated with a cycle of the distortion correcting signal at the time of inputting no audio signal. Accordingly, an output switching transistor is turned to ON state intermittently, leading to the suppression of an increase in power consumption.

Patent Document (Patent Document 1) Japanese Patent Laid-open No. 2001-268977
(Patent Document 2) Japanese Patent Laid-open No. 2004-312606

SUMMARY OF THE INVENTION

Generally, a voltage-feedback class-D amplifier circuit is used as a circuit which drives an actuator or a motor. Using the voltage-feedback class-D amplifier circuit has a purpose of making the power consumption smaller, compared with a BTL (Bridged Transformer-Less) amplifier of an analog drive. However, the voltage-feedback class-D amplifier circuit has drawbacks generally in linearity, a frequency characteristic, and noise performance.

In driving a load such as an actuator or a motor, a dead time is provided as described above. The dead time is a period during which an effective load driving current cannot be generated. Therefore, to a driving pulse which corresponds to a command value for a circuit for driving a power MOS transistor (an insulated-gate field effect transistor) of an output stage, an on period of the output transistor becomes short as much as the dead time, and there arises a difference from the command value. Especially, when the on period of the command value is shorter, percentage that the dead time occupies becomes larger, and influence of the error becomes larger (since the dead time is a fixed value). The state where the on period is short in the output driving pulse corresponds to the case where the amplitude of an input signal is small. Therefore, when the amplitude of an input signal is small, the difference from the command value, or an error, becomes large and it becomes difficult to drive an output load precisely.

When speed at which a command value changes is slower enough than the speed of response of a class D amplifier circuit, the difference from the command value can be corrected by feedback control. However, when the speed at which the command value changes is fast, the correction cannot follow the speed, and it becomes difficult to drive a load precisely corresponding to an input signal. The present issue presents a cause of deterioration of the frequency characteristic observed when the amplitude of the input signal is small.

Especially, in the case where the load is an actuator or a motor which drives a BD (a blue-ray disk) for example, a high speed following is required and it is desirable to improve the frequency characteristic of the amplifying circuit. In the case of a BD, the amount of information per recording surface is about five or more times larger, compared with a conventional DVD (digital versatile disk) optical disk. Accordingly, in order to realize the high speed following with a highly precise focusing to a recording bit of the BD, it is desirable to improve the frequency characteristic.

One of possible methods of reducing degradation of the frequency characteristic is to shorten the dead time. However, due to variation of transistor characteristics resulting from parameter variation in a semiconductor manufacturing process and due to warranty coverage of use conditions, it is necessary to secure a margin in order to prevent disappearance of a dead time; accordingly, there is a limit also in reduction of the dead time.

When feedback control of output voltage is performed, a smoothing circuit is used in feeding back the output voltage to the input side. By using the feedback control, an output error can be corrected. When the speed of change of a command value is slower enough than the speed of response of a class D amplifier circuit, the output error (a difference between the command value and an "on" period of a transistor) can be corrected by the feedback control. However, when the speed of change of a command value is fast, the error correction becomes difficult to follow in time and precise driving of a load such as an actuator becomes difficult. To cope with the case, reduction of a time constant of the smoothing circuit for the feedback control can be considered. However, it is necessary to secure the magnitude of attenuation of a PWM carrier (a triangular-wave signal); accordingly, there is a limit also in the reduction of the time constant, and a great effect cannot be expected.

In the above-described Patent Document 1, one of triangular-wave signals which are level-shifted is selected and outputted, corresponding to the level of an input signal. However, in the case of such configuration of selectively switching the triangular-wave signals, stability and accuracy of a load driving current may deteriorate due to discontinuous control action in switching the triangular-wave signals.

In the configuration disclosed by Patent Document 2, a distortion correcting signal is superimposed on an input audio signal. Therefore, when the input signal is small, it is likely that stability and accuracy of a load driving current will deteriorate due to the distortion correcting signal. It is also likely that a noise component unnecessary for the load driving current may get mixed in, due to the waveform of the distortion correcting signal.

The present invention has been made in view of the above circumstances and provides a pulse width modulation circuit which can generate a PWM signal precisely even when an input signal is small in magnitude.

The present invention also intends to provide a voltage-feedback class-D amplifier circuit which can generate precisely an output load driving signal corresponding to a command value, without producing a noise component, and which is excellent in a frequency characteristic.

The present invention is summarized as follows: the waveform of a triangular-wave signal, which functions as a modulating signal in generating a PWM signal, is adjusted depending on the level of the triangular-wave signal, so that a slew rate may be changed in an area in which the frequency characteristic of the amplifier circuit deteriorates. In one embodiment, the gradient (slew rate) is made small in the vicinity of the central value of the amplitude of the triangular-wave signal, compared with other areas.

The gradient (slew rate) of a triangular wave of a PWM carrier is adjusted in an area where the frequency characteristic of an output stage transistor deteriorates. By adjusting the gradient (slew rate) of the triangular wave, the closed-loop frequency characteristic can be adjusted so as to be less deteriorated and the frequency domain can be shifted to a low frequency region equivalently; accordingly, the frequency characteristic is improved.

BRIEF DESCRIPTION OF THE DRAWINGS

FIG. 8 (B) is a drawing illustrating a frequency characteristic of phase of the output load driving device illustrated in FIG. 4;

FIG. 21 (A) is a top view of an optical pickup unit illustrated in FIG. 20; and

FIG. 21 (B) is a side view of the optical pickup unit illustrated in FIG. 20.

DETAILED DESCRIPTION OF THE PREFERRED EMBODIMENTS

Fundamental Configuration

Figure 1:
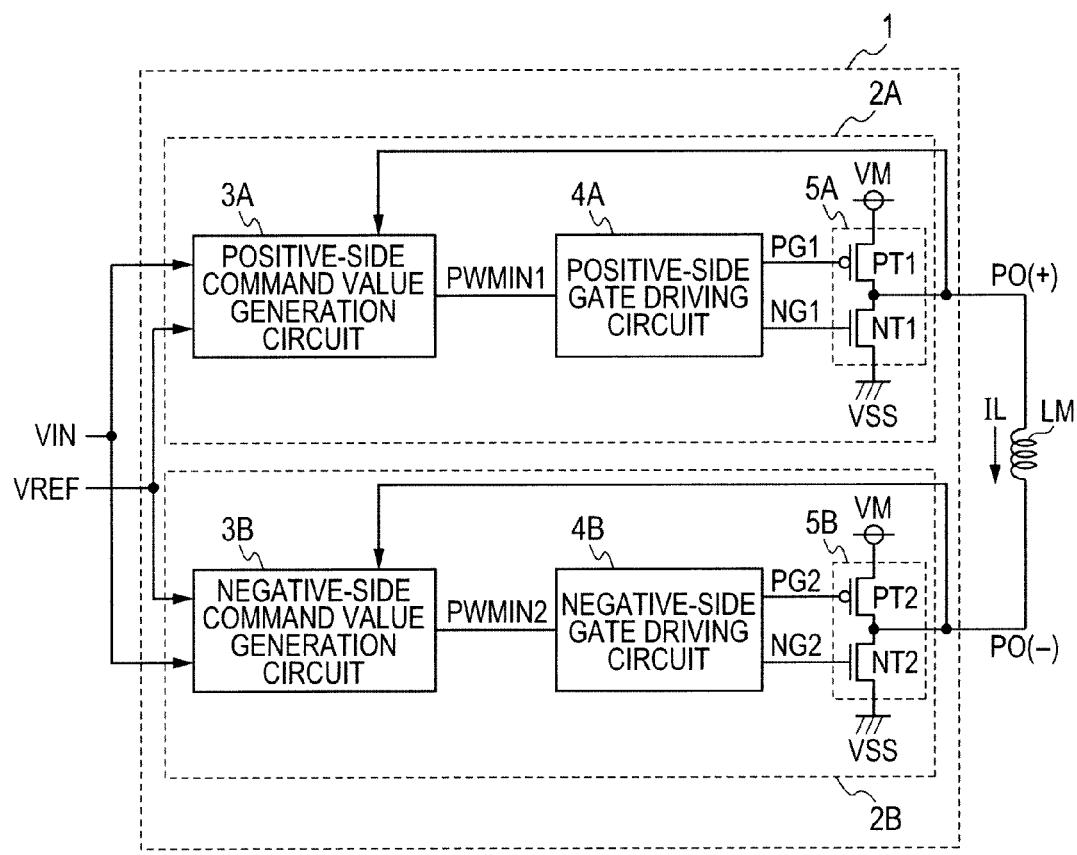
FIG. 1 is a conceptual diagram illustrating configuration of an output load driving device according to the present invention.

FIG. 1 illustrates roughly entire configuration of an output load driving device according to the present invention. In FIG. 1, the output load driving device 1 drives an inductive load LM according to an input signal VIN. The inductive load LM is coupled between a positive-side output node PO(+) and a negative-side output node PO(−).

The output load driving device 1 includes a positive-side output driving circuit 2A which drives the positive-side output node PO(+), and a negative-side output driving circuit 2B which drives the negative-side output node PO(−). The positive-side output driving circuit 2A and the negative-side output driving circuit 2B operate complementarily, and pass current through the inductive load LM bi-directionally.

The positive-side output driving circuit 2A includes a positive-side command value generation circuit 3A which generates a positive-side command value PWMIN1 according to the input signal VIN and a reference voltage VREF; a positive-side gate driving circuit 4A which generates positive-side gate driving signals PG1 and NG1 according to the positive-side command value PWMIN1; and an output circuit 5A which drives the positive-side output node PO(+) according to the positive-side gate driving signals PG1 and NG1.

The positive-side command value generation circuit 3A receives and filters a signal of the positive-side output node PO(+) (hereafter the positive-side output node PO(+) and a voltage signal thereof will be indicated by the same symbol PO(+)). The positive-side command value generation circuit 3A performs differential amplification of the input signal VIN and the reference voltage VREF, performs further differential amplification of the positive-side output signal PO(+) fed back and the difference signal generated above, and generates the positive-side command value PWMIN1.

The positive-side gate driving circuit 4A generates the gate driving signals PG1 and NG1 which drive the output circuit 5A in consideration of a dead time according to the command value PWMIN1. The output circuit 5A includes a P-channel MOS transistor (an insulated-gate field effect transistor) PT1 which is coupled with a power node and receives the gate driving signal PG1 at the gate thereof, and an N-channel MOS transistor NT1 which receives the gate driving signal NG1 at the gate thereof. The MOS transistor PT1 drives the positive-side output node PO(+) to a level of a high-side power source voltage VM when conducted, and the MOS transistor NT1 drives the positive-side output node PO(+) to a level of a low-side power source voltage (ground voltage) VSS when conducted.

As well as the positive-side output driving circuit 2A, the negative-side output driving circuit 2B includes a negative-side command value generation circuit 3B; a negative-side gate driving circuit 4B; and an output circuit 5B. The negative-side command value generation circuit 3B performs differential amplification of the input signal VIN and the reference voltage VREF, in a complementary mode with the positive-side command value generation circuit 3A. The negative-side command value generation circuit 3B performs further differential amplification of the above-obtained difference signal and a signal fed back from the negative-side output node PO(−), and generates a negative-side command value PWMIN2.

The negative-side gate driving circuit 4B generates gate driving signals PG2 and NG2 which drive the output circuit 5B in consideration of a dead time according to the command value PWMIN2. The output circuit 5B includes a P-channel MOS transistor PT2 which receives the gate driving signal PG2 at the gate thereof, and an N-channel MOS transistor NT2 which receives the gate driving signal NG2 at the gate thereof. The MOS transistor PT2 drives the negative-side output node PO(−) to the level of the high-side power source voltage VM when conducted, and the MOS transistor NT2 drives the negative-side output node PO(−) to the level of the low-side power source voltage (ground voltage) VSS when conducted.

Charge and discharge to the positive-side output node PO(+) are performed by the MOS transistors PT1 and NT1, and charge and discharge of the negative-side output node PO(−) are performed by the MOS transistors PT2 and NT2. These MOS transistors PT1, NT1, PT2, and NT2 are comprised of a power MOS transistor as an example, and are driven at high speed to supply a large current to the inductive load LM.

Figure 2:
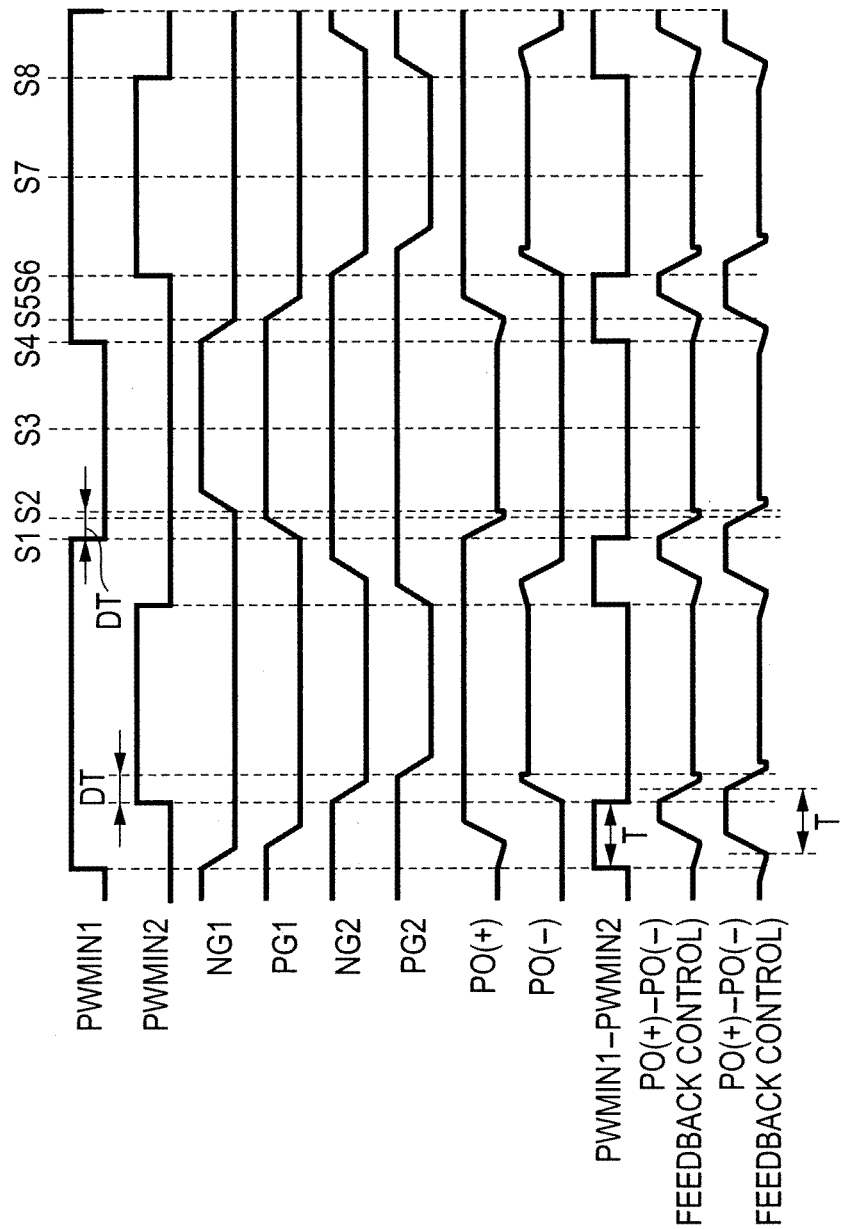
FIG. 2 is a timing chart illustrating operation of the output load driving device illustrated in FIG. 1.

FIG. 2 is a timing chart illustrating operation of the output load driving device 1 illustrated in FIG. 1. FIGS. 3(A) to 3(H) illustrate a series of operational states of the transistors included in the output circuit illustrated in FIG. 1 along with the corresponding current paths. With reference to FIGS. 2 and 3, the following explains briefly the operation of the output load driving device 1 illustrated in FIG. 1.

The positive-side command value generation circuit 3A and the negative-side command value generation circuit 3B generate the command values PWMIN1 and PWMIN2, respectively, corresponding to a voltage level of the input signal VIN to the reference voltage VREF. The positive-side gate driving circuit 4A provides a dead time DT at falling of the high-side command value PWMIN1, drives the gate driving signal NG1 to H level, and drives the N-channel MOS transistor NT1 of the output circuit 5A to ON state. At this time, the positive-side gate driving circuit 4A drives the gate driving signal PG1 directed to the P-channel MOS transistor PT1, to H level at early timing, and drives the P-channel MOS transistor PT1 to OFF state.

On the other hand, the negative-side gate driving circuit 4B drives the gate driving signal NG2 to L level with a delay of the dead time DT at rising of the negative-side command value PWMIN2, and drives the N-channel MOS transistor NT2 of the corresponding output circuit 5B to OFF state. After that, the negative-side gate driving circuit 4B drives the gate driving signal PG2 to L level, and drives the P-channel MOS transistor PT2 to OFF state.

The MOS transistors PT1, NT1, PT2, and NT2 are power MOS transistors, and have body diodes BDD1-BDD4 inside, respectively. When the MOS transistors turn off, a current IL is induced to flow continuously through the inductive load LM via these body diodes. That is, in State S1 of a falling edge of the command value PWMIN1 in FIG. 2, the command value PWMIN2 is L level. As illustrated in the operational state of FIG. 3(A) at the present time, the gate driving signals NG1 and PG1 are L level, and the gate driving signals PG2 and NG2 are H level. Therefore, in State S1, the MOS transistors PT2 and NT1 are in OFF state (non-conductive state), and the MOS transistors PT1 and NT2 are in ON state (conductive state), on the other hand. Therefore, the current flows from the power node VM, passing through the MOS transistor PT1, the output node PO(+), the inductive load LM, the output node PO(−), and the MOS transistor NT2, to the ground node VSS. The present current drives the inductive load LM.

Next, the time chart moves to a period of the dead time DT. As illustrated in FIG. 2 and the operational state of FIG. 3(B), in State S2 before the dead time elapses, the gate driving signals PG1 and PG2 are H level, the gate driving signal NG1 is L level, and the gate driving signal NG2 is H level. All of the MOS transistors PT1, PT2, and NT1 are in OFF state, and the MOS transistor NT2 is in ON state. In this case, in the inductive load LM, an induced current flows in the same direction owing to the inductance component of the inductive load LM. At the time when the induced current is supplied, the current is supplied from the ground node VSS to the inductive load LM via the body diode BDD2 of the MOS transistor NT1. Due to a voltage drop across the body diode BDD2, the positive-side output node PO(+) experiences undershoot and turns to LU level which is still lower than L level of the ground voltage VSS. Accordingly, the current flows from the ground node VSS, passing through the inductive load LM and the MOS transistor NT2, to the ground node VSS. Here, a node and a voltage thereof are indicated by the same symbol.

Figure 3A:
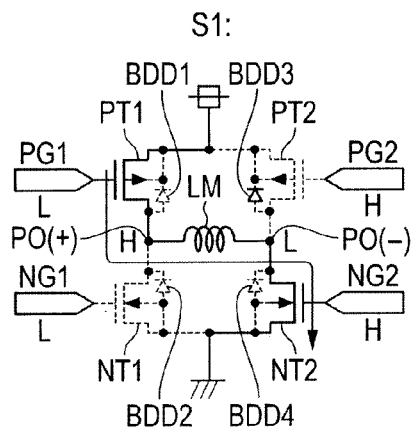
FIGS. 3(A) to 3(H) illustrates a series of operational states of transistors included in the output circuit illustrated in FIG. 1 along with the corresponding current paths.
Figure 3B:
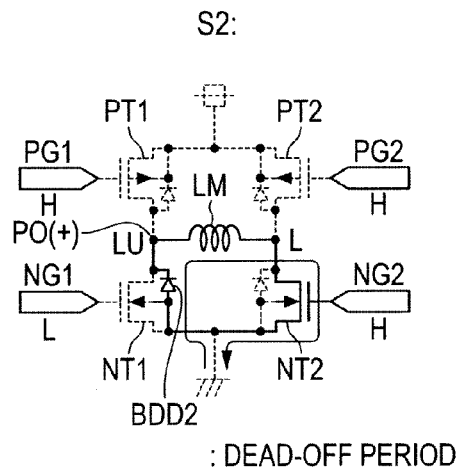
Figure 3C:
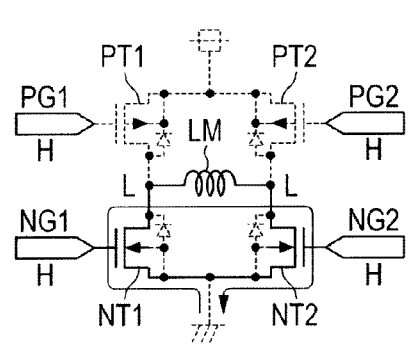
Figure 3D:
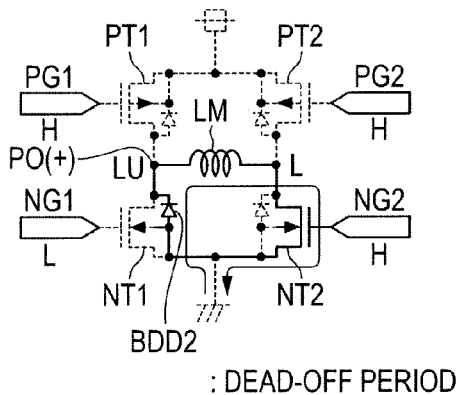
Figure 3E:
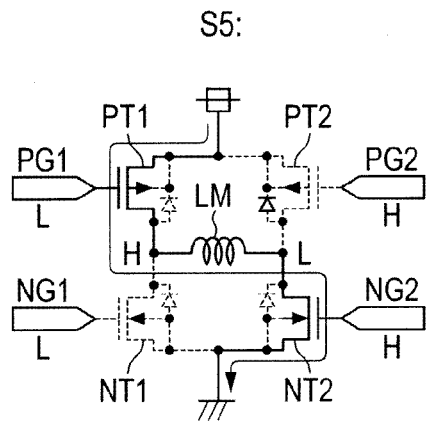

Next, in an equilibrium state S3 illustrated in FIG. 2 and in the operational state of FIG. 3(C) after the dead time DT has elapsed, all of the gate driving signals PG1, PG2, NG1, and NG2 are H level. Therefore, the MOS transistors PT1 and PT2 are in OFF state, and the MOS transistors NT1 and NT2 are in ON state. In the present state, the current is supplied to the inductive load LM via the MOS transistor NT1, as illustrated in the operational state of FIG. 3(C). The present state is the state of the so-called "ground source regeneration", and a regenerative current flows from the ground node VSS to the inductive load LM via the MOS transistor NT1. When the output node PO(+) and the output node PO(−) become equal in voltage level and reach L level, no current flows.

Then, according to the input signal VIN, the command value PWMIN1 fed from the high-side command value generation circuit 3A rises to H level. The present state is State S4 illustrated in FIG. 2 and the operational state illustrated in FIG. 3(D). In State S4, as illustrated in the operational state of FIG. 3(D), the gate driving signals PG1, PG2, and NG2 remain on H level, and the gate driving signal NG1 shifts to L level. Therefore, the MOS transistors PT1, PT2, and NT1 are in OFF state and the MOS transistor NT2 is in ON state. Induced current flows from the body diode BDD2 of the MOS transistor NT1, passing through the inductive load LM and the MOS transistor NT2, to the ground node VSS. The voltage level of the positive-side output node PO(+) falls to LU level even lower than L level due to a voltage drop across the body diode BDD2.

After the elapse of the dead time from the rising of the positive-side command value PWMIN1, and after the gate driving signal NG1 turns to L level, the gate driving signal PG1 turns to L level (State S5). In State S5, as illustrated in the operational state of FIG. 3(E), the gate driving signals PG1 and NG1 are L level, and the gate driving signals PG2 and NG2 are H level; accordingly, the MOS transistors PT1 and NT2 are in ON state, and the MOS transistors NT1 and PT2 are in OFF state. The current is supplied from the high-side power source node to the inductive load LM through the MOS transistor PT1. The current which flows through the inductive load LM passes further through the MOS transistor NT2 and is discharged to the ground node. In State S5, the voltage of the positive-side output node PO(+) rises to H level, and the negative-side output node PO(−) is maintained to the ground voltage level.

Figure 3F:
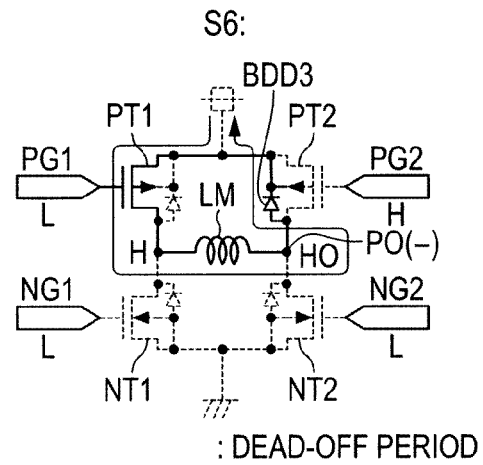

In a rising edge (State S6) when the negative-side command value PWMIN2 fed from the negative-side command value generation circuit 3B rises to H level, as illustrated in the operational state of FIG. 3(F), the gate driving signals PG1 and NG1 are L level, the gate driving signal NG2 shifts to L level, and the gate driving signal PG2 is H level. The MOS transistors PT2, NT1, and NT2 turn to OFF state, and the MOS transistor PT1 remains in ON state. In State S6, the current flows from the high-side power source node, passing through the MOS transistor PT1, to the inductive load LM. The current supplied through the inductive load LM flows into the high-side power source node through the body diode BDD3 of the MOS transistor PT2. In the present state, the voltage level of the negative-side output node PO(−) becomes higher than the voltage level of the high-side power source node as much as a voltage drop across the body diode BDD3, and the voltage level of the negative-side output node PO(−) experiences an overshoot, shifting to HO level. The present case is what is called a dead-off period.

In State S7 after the elapse of the dead time, the gate driving signal PG2 falls to L level and drives the MOS transistor PT2 to ON state. Accordingly, the overshoot component due to the body diode BDD3 disappears, and the negative-side output node PO(−) is maintained at the power supply voltage level by the MOS transistor PT2.

Figure 3G:
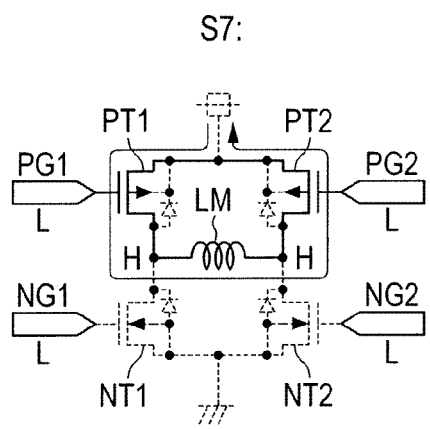
Figure 3H:
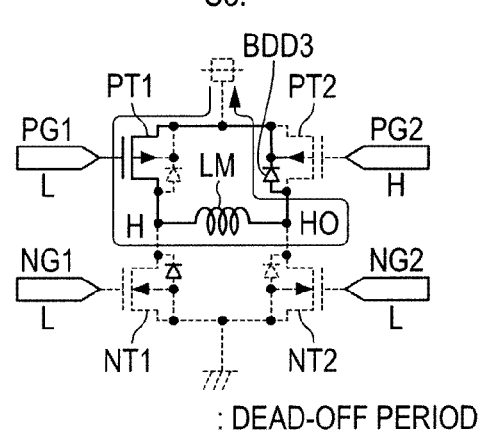

As illustrated in the operational state of FIG. 3(G), in State S7 after the elapse of the dead time, all of the gate driving signals PG1, PG2, NG1, and NG2 are L level; accordingly, the MOS transistors PT1 and PT2 are in ON state, and the MOS transistors NT1 and NT2 are in OFF state. The current flows from the high-side power source node to the inductive load LM through the MOS transistor PT1, and the current from the inductive load LM flows through the MOS transistor PT2 to the high-side power source node. That is, a state of "power source regeneration" is realized.

Subsequently, in State S8 after the power source regeneration, the negative-side command value PWMIN2 falls to L level, and the gate driving signal PG2 rises to H level. Since the dead time has not elapsed yet at this moment, the gate driving signal NG2 is L level. Therefore, as illustrated in the operational state of FIG. 3(H), the gate driving signals PG1, NG1, and NG2 are L level and the gate driving signal PG2 is H level; accordingly, the MOS transistor PT1 is in ON state, and the MOS transistors NT1, NT2, and PT2 are in OFF state. Therefore, the current flows from the high-side power source node to the inductive load LM through the MOS transistor PT1, and the induced current flows through the body diode BDD3 of the MOS transistor PT2 to the high-side power source node. The present state is a dead-off period. After the elapse of the present dead-off period, the operational state shifts to the operational state illustrates in FIG. 3(A) again.

As illustrated in FIG. 2, a dead time (dead-off period) is provided to a falling edge of the positive-side command value PWMIN1, and to a rising edge of the negative-side command value PWMIN2, respectively. Thereby, owing to the dead time during which current flows through the inductive load LM and the body diode, it is possible to avoid the situation in which a P-channel MOS transistor and an N-channel MOS transistor which are coupled to the output node PO(+) or PO(−) would be in ON state at the same time and an arm short-circuit current would flow from the high-side power source node to the low-side power source node. In order to absorb a reverse recovery current which flows through body diodes BDD1-BDD4, the period during which the regenerative current flows is provided.

In this case, the gate driving circuits 4A and 4B generate a voltage difference onto the output nodes PO(+) and PO(−), so that the current should flow during the time defined by the dead time, to the difference of the command values PWMIN1-PWMIN2 which specifies the voltage difference of the output nodes PO(+) and PO(−). At this time, the voltages of the output nodes PO(+) and PO(−) are fed back to the command value generation circuits 3A and 3B, respectively, and feedback control is performed so that an average voltage value of the output nodes may become equal to the level of the input voltage VIN. Therefore, as illustrated in FIG. 2, an H-level period of voltage (difference voltage) between the output nodes PO(+) and PO(−) before performing the feedback control becomes shorter than the command value by the dead time. On the other hand, the H-level period of the voltage value (after the feedback control) between the output nodes PO(+) and PO(−) is lengthened by the voltage feedback and becomes equal to the H-level period T of the command value; accordingly otherwise possible degradation under the influence of the dead time is suppressed. Although the H-level period of the output voltage PO(+)−PO(−) for the feedback control is made almost equal to the pulse width of the difference command value PWMIN1−PWMIN2 in this case, the H-level period will become somewhat short if the rising and falling period of the output voltage is taken into consideration.

The dead time is a fixed value, therefore, the shorter the "on period" (H-level period) of the difference of the command values (PWMIN1−PWMIN2) is, the larger the percentage that the dead time occupies becomes. The influence of the period which the dead time occupies becomes large in a case where the input signal has small amplitude and where the output difference value PO(+)−PO(−) takes a value near 0V. When the dead time is comparable to or longer than the H-level period of the output pulse, the feedback control of the output voltage takes time for setting the output voltage to a period corresponding to the command value. Accordingly, at a high-speed operation, the correction of error between the command value and the output voltage becomes difficult. In the present invention, in order to make the error correction precisely at the time of inputting a small amplitude signal, the gradient (slew rate) of a triangular wave is adjusted so as to improve a closed-loop frequency characteristic. Hereafter, the specific configuration is explained.

Figure 4:
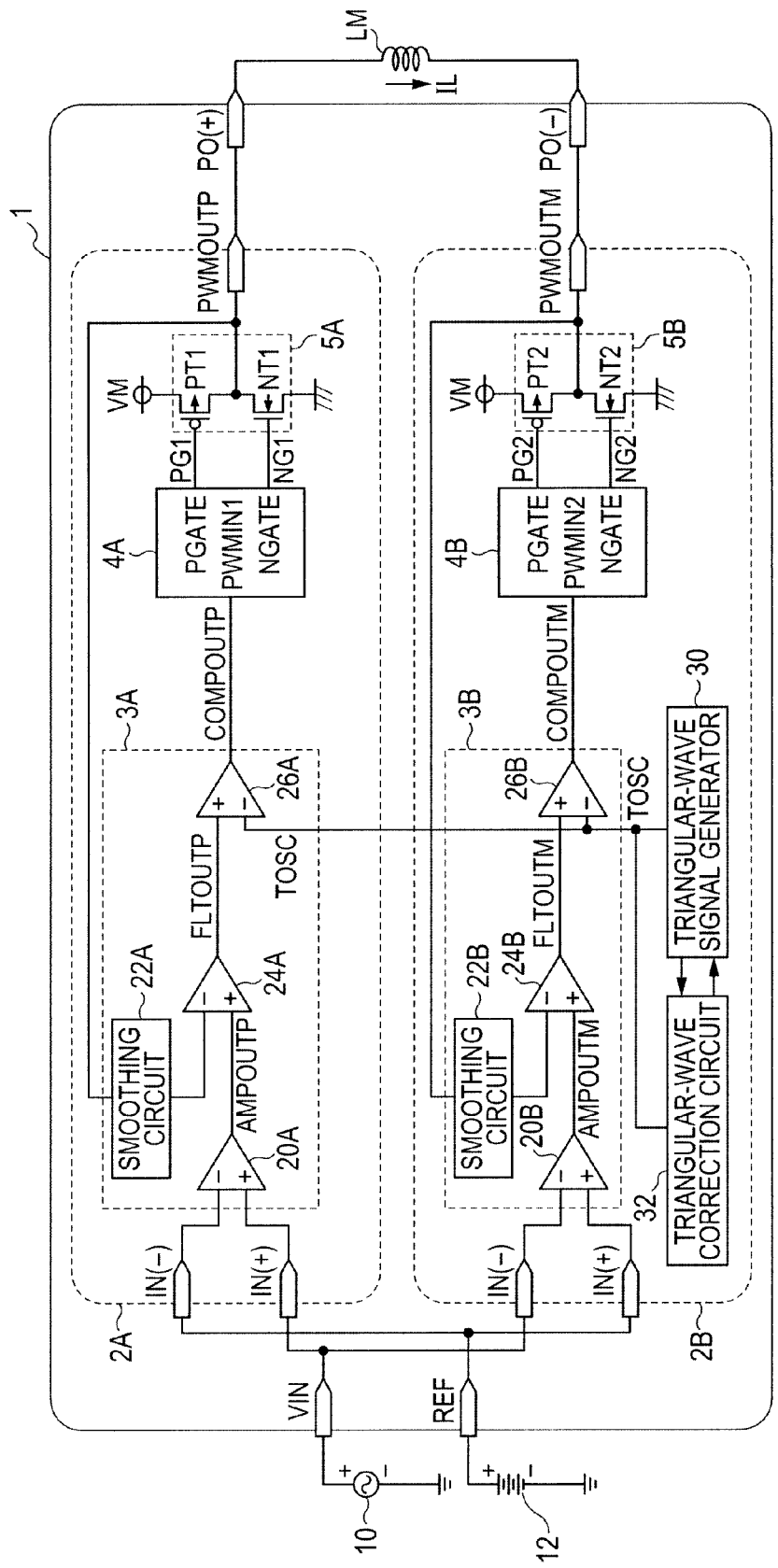
FIG. 4 is a drawing illustrating roughly a specific configuration of the output load driving device according to the present invention.

FIG. 4 illustrates more concretely configuration of the output load driving device 1 illustrated in FIG. 1. In FIG. 4, the output load driving device 1 receives an input signal VIN from a signal source 10 and a reference voltage REF from a reference voltage source 12, and generates a voltage signal corresponding to the difference of these signals to the output nodes PO(+) and PO(−) which drive the inductive output load LM. The positive-side output driving circuit 2A and the negative-side output driving circuit 2B are comprised of a voltage-feedback class-D amplifier circuit. Hereafter, the positive-side output driving circuit 2A and the negative-side output driving circuit 2B are called a voltage-feedback class-D amplifier circuit.

The voltage-feedback class-D amplifier circuit 2A receives the input signal VIN at the input node IN(+) and the reference voltage REF at the input node IN(−), respectively. The positive-side command value generation circuit 3A includes a differential amplifier circuit 20A which amplifies in a differential mode the input signal VIN and the reference voltage REF; a smoothing circuit 22A which filters an output signal PWMOUTP of an output circuit 5A; an amplifying-stage differential amplifier circuit 24A which amplifies in a differential mode an output signal of the smoothing circuit 22A and an output signal AMPOUTP of the differential amplifier circuit 20A; and a PWM comparator 26A which performs pulse width modulation of an output signal FLTOUTP of the amplifying-stage differential amplifier circuit 24A.

The differential amplifier circuit 20A receives the input signal VIN supplied through the input node IN(+) at the plus input thereof, and receives the reference voltage REF supplied through the input node IN(−) at the minus input thereof. The smoothing circuit 22A has configuration of an RC lowpass filter which includes a capacitive element and a resistive element, and generates a signal which is an averaged output signal PWMOUTP of the output circuit 5A. The amplifying-stage differential amplifier circuit 24A receives the output signal AMPOUTP of the differential amplifier circuit 20A at the plus input thereof, and receives the output signal of the smoothing circuit 22A at the minus input thereof. Feedback control is performed by the smoothing circuit 22A and the amplifying-stage differential amplifier circuit 24A so that the output signal PWMOUTP may become equal to the output signal AMPOUTP of the differential amplifier circuit 20A.

The PWM comparator 26A receives a triangular-wave signal TOSC generated by a triangular-wave signal generator 30 and a triangular-wave correction circuit 32 at the minus input thereof, and receives an output signal FLTOUTP of the amplifying-stage differential amplifier circuit 24A at the plus input thereof. The PWM comparator 26A compares these signals and generates a binary output signal COMPOUTP according to the comparison result. In this way, a pulse-width-modulated signal of the output signal FLTOUTP of the amplifying-stage differential amplifier circuit 24A is generated by the PWM comparator 26A.

The positive-side gate driving circuit 4A receives the output signal COMPOUTP of the PWM comparator 26A as a command value at a command value input node PWMIN1, and generates gate driving signals PG1 and NG1 at output nodes PGATE and NGATE, respectively. The positive-side gate driving circuit 4A includes a delay circuit inside, and generates the gate driving signals PG1 and NG1 with a fixed delay time (dead time) to the falling or the rising of the signal (command value) supplied to the command value input node PWMIN1. In the description given here, a node and a signal thereof are indicated with the same symbol.

The output circuit 5A includes power MOS transistors PT1 and NT1 which receive the gate driving signals PG1 and NG1 from the gate driving circuit 4A at the gates thereof, in the same way as the configuration illustrated in FIG. 1.

The voltage-feedback class-D amplifier circuit 2B has the same configuration as the voltage-feedback class-D amplifier circuit 2A. That is, the negative-side command value generation circuit 3B includes a differential amplifier circuit 20B; a smoothing circuit 22B; an amplifying-stage differential amplifier circuit 24B; and a PWM comparator 26B. The differential amplifier circuit 20B receives the input signal VIN supplied through the input node IN(−) at the minus input thereof, and receives the reference voltage REF supplied through the input node IN(+) at the plus input thereof.

The smoothing circuit 22B passes a low-frequency component of the output signal PWMOUTM of the output circuit 5B, and generates a signal which is the averaged output signal PWMOUTM. The amplifying-stage differential amplifier circuit 24B receives an output signal AMPOUTM of the differential amplifier circuit 20B at the plus input thereof, receives an output signal of the smoothing circuit 22B at the minus input thereof, and performs differential amplification of these signals to generate a signal FLTOUTM.

The PWM comparator 26B receives at the minus input thereof the triangular-wave signal TOSC which the triangular-wave signal generator 30 and the triangular-wave correction circuit 32 generate, and receives at the plus input thereof the output signal FLTOUTM of the amplifying-stage differential amplifier circuit 24B. The PWM comparator 26B compares the levels of these signals and generates a binary signal COMPOUTM.

In the command value generation circuits 3A and 3B, the input signal VIN and the reference voltage REF are mutually supplied in a complementary mode to the differential amplifier circuits 20A and 20B of the input stage. Therefore, the output signals AMPOUTP and AMPOUTM of the differential amplifier circuits 20A and 20B are complementary with each other. The negative-side gate driving circuit 4B receives at the command value input node PWMIN2 thereof the output signal COMPOUTM of the PWM comparator 26B, as a command value, and generates gate driving signals PG2 and NG2 at the output nodes PGATE and NGATE, according to the command value.

The output circuit 5B includes power MOS transistors PT2 and NT2 which receive the gate driving signals PG2 and NG2 from the gate driving circuit 4B at the gates thereof, in the same way as the configuration illustrated in FIG. 1.

The triangular-wave signal generator 30 generates a triangular-wave signal which has a fixed-gradient waveform. Although the configuration and operation will be explained in detail later, the triangular-wave correction circuit 32 adjusts the gradient (slew rate) of the triangular-wave signal outputted by the triangular-wave signal generator 30, depending on the voltage level.

The voltage-feedback class-D amplifier circuits 2A and 2B are built up as a module, respectively, and arranged on a chip which contains the output load driving device 1.

First, operation of the output load driving device 1 illustrated in FIG. 4 is explained for a case where correction operation of the triangular-wave correction circuit 32 is not performed.

Figure 5:
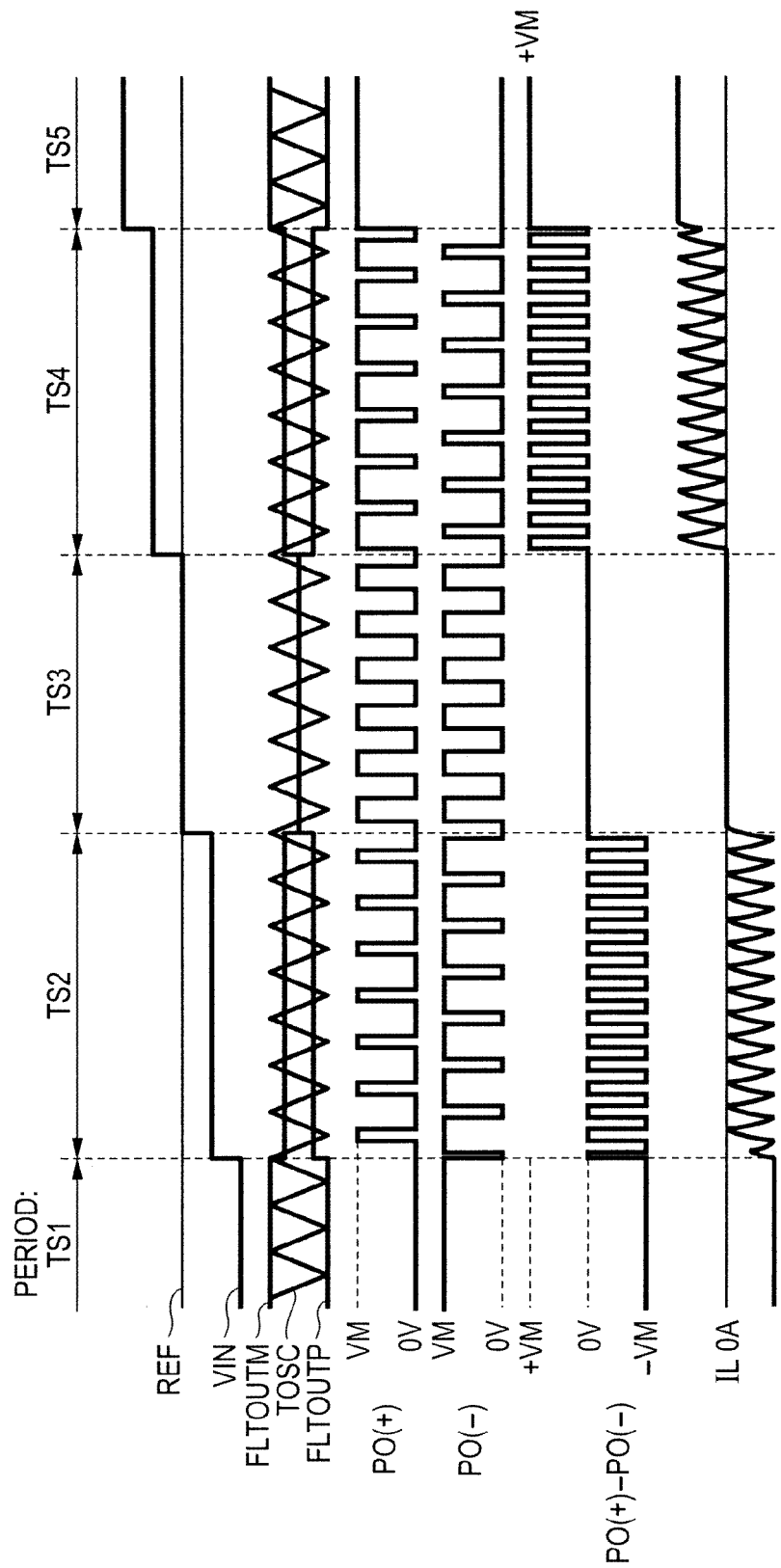
FIG. 5 is a timing chart illustrating operation of the output load driving device illustrated in FIG. 4.

FIG. 5 is a timing chart illustrating the operation of the output load driving device 1 illustrated in FIG. 4 when the operation of the triangular-wave correction circuit 32 is stopped. Hereafter, with reference to FIG. 5, the operation of the output load driving device 1 illustrated in FIG. 4 is explained when the triangular-wave correction is stopped.

In FIG. 5, a triangular-wave signal TOSC which has fixed amplitude and gradient is generated by the triangular-wave signal generator 30. In a period TS1, the input signal VIN is well lower than the reference voltage REF, and negative in a voltage state on the basis of the reference voltage REF. In the period TS1, the output signal AMPOUTP of the differential amplifier circuit 20A is on a low level, and the output signal AMPOUTM of the differential amplifier circuit 20B is on a high level. The smoothing circuits 22A and 22B perform low pass filtering to the signals PWMOUTP and PWMOUTM supplied to the output nodes PO(+) and PO(−), respectively. Accordingly, the output signal FLTOUTP of the amplifying-stage differential amplifier circuit 24A is on the level of the ground voltage (VS) and the output signal FLTOUTM of the amplifying-stage differential amplifier circuit 24B is on the level of the power supply voltage (VM).

In this case, the output signals FLTOUTP and FLTOUTM of the amplifying-stage differential amplifier circuits 24A and 24B are greater than a peak value of triangular-wave signal TOSC in the absolute value. Therefore, the command values COMPOUTP (PWMIN1) and COMPOUTM (PWMIN2) from the PWM comparators 26A and 26B turn to L level and H level, respectively; correspondingly, the positive-side output node PO(+) becomes on the level of the ground voltage, and the negative-side output node PO(−) becomes on the level of the power supply voltage (VM). Therefore, the voltage PO(+)−PO(−) applied to the output load LM is a negative voltage (−VM), and the current IL which flows through the output load LM is a negative maximum current.

The present period corresponds to a case where the absolute voltage value |(VIN−REF)·G| exceeds the power supply voltage VM, wherein the voltage value (VIN−REF)·G is equal to the difference (VIN−REF) of the input signal VIN with the reference voltage REF, multiplied by a gain G of the output load driving device 1. Accordingly, the output nodes PO(+) and PO(−) are brought to the level of ground voltage and the level of power supply voltage VM, respectively, and the maximum current is generated.

In a period TS2, the input signal VIN has a slightly negative voltage level on the basis of the reference voltage REF. In the present period TS2, the output signal FLTOUTP of the amplifying-stage differential amplifier circuit 24A rises a little bit in the voltage level; on the other hand, the output signal FLTOUTM of the amplifying-stage differential amplifier circuit 24B falls a little bit in the voltage level.

The PWM comparators 26A and 26B compare the voltage level of the triangular-wave signal TOSC and those of the output signals FLTOUTP and FLTOUTM, respectively. According to the comparison result, the PWM comparator 26A generates, as the output signal COMPOUTP, a pulse signal which turns to H level while the voltage level of the output signal FLTOUTP of the amplifying-stage differential amplifier circuit 24A is higher than the voltage level of the triangular-wave signal TOSC. On the other hand, the PWM comparator 26B generates, as the output signal COMPOUTM, a pulse signal which turns to H level while the voltage level of the output signal FLTOUTM of the amplifying-stage differential amplifier circuit 24B is higher than the voltage level of the triangular-wave signal TOSC.

When the signal COMPOUTP supplied to the command value input node PWMIN1 is H level, the output driving circuit 4A generates gate driving signals PG1 and NG1 so that the corresponding output node may be driven to H level. Similarly, when the signal COMPOUTM supplied to the command value input node PWMIN2 is H level, the output driving circuit 4B generates gate driving signals PG2 and NG2 so that the corresponding output node may be driven to H level. Therefore, the output node PO(+) acts as H level during a period corresponding to the period when the output signal FLTOUTP is higher than the triangular-wave signal TOSC (the dead time is taken into consideration). On the other hand, the output node PO(−) acts as H level during a period corresponding to the period when the output signal FLTOUTM is higher than the triangular-wave signal TOSC.

The voltage PO(+)−PO(−) applied to the output load LM turns to a negative voltage level (−VM) only for a period when the voltage levels of the output nodes PO(+) and PO(−) differ from each other. Accordingly, as the current IL which flows through the output load LM, a negative pulse current flows, exhibiting rising and falling with a time constant depending on the output load. In the present case, the voltage of the output nodes PO(+) and PO(−) is switched at a PWM carrier frequency (frequency of the triangular-wave signal TOSC).

In the present negative pulse generation, the voltage (VIN−REF)·G is generated, which is the voltage of the input signal VIN subtracted by the reference voltage, (VIN−REF), and multiplied by the gain G of the voltage-feedback class-D amplifier circuit 2A. That is, the feedback control of the output voltage of the amplifying-stage differential amplifier circuit 24A is performed so that the output signal AMPOUTP of the differential amplifier circuit 20A and the averaged voltage of the output node PO(+) supplied through the smoothing circuit 22A may become equal. Similar feedback control is performed in the amplifying-stage differential amplifier circuit 24B, so that the average voltage which is a smoothed voltage of the output node PO(−) supplied through the smoothing circuit 22B and the voltage level of the output signal AMPOUTM of the differential amplifier circuit 20B may become equal. By this voltage feedback control, an error in the output driving period of the command value and the output circuits 5A and 5B is reduced. A PWM-modulated signal is generated by comparison with the triangular-wave signal TOSC in the PWM comparators 26A and 26B.

In a period TS3, the input signal VIN and the reference voltage REF are identical in the voltage level. In the present period, the output signals FLTOUTP and FLTOUTM of the amplifying-stage differential amplifier circuits 24A and 24B become equal in the voltage level to the center value of the peak value of the triangular-wave signal TOSC, and a voltage of the same waveform with a duty of 50% is applied to the output nodes PO(+) and PO(−). Therefore, in the present case, the voltage PO(+)−PO(−) applied to the output load LM becomes 0V and the current IL becomes 0A.

In a period TS4, the input signal VIN has a slightly positive voltage level on the basis of the reference voltage REF. In the period TS4, the polarity of each signal in the period TS2 is reversed. The voltage PO(+)−PO(−) applied to the output load LM has a reversed polarity to the voltage in the period TS2, and acts as a pulse signal which changes between the ground voltage 0V and the power supply voltage VM; accordingly a positive current flows as the current IL.

In a period TS5, the input signal VIN is sufficiently greater in the voltage level than the reference voltage REF. In the period TS5, the polarity of each signal in the period TS1 is reversed and a positive current IL flows through the output load LM, contrary to the negative current in the period TS1.

The period TS3 is a period when the current IL does not flow through the output load. When the inductive output load LM is an actuator or a motor, superposition of a noise etc. will cause malfunction.

Figure 6:
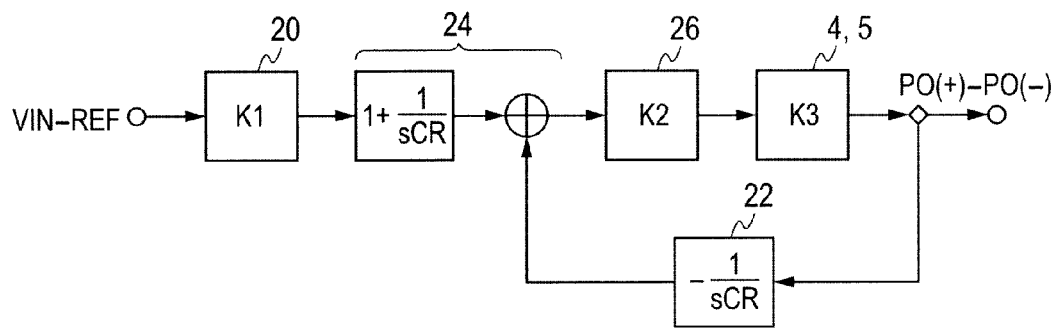
FIG. 6 is a block diagram illustrating a transfer function of a class D amplifier circuit of the output load driving device illustrated in FIG. 4.

FIG. 6 is a block diagram illustrating transfer characteristics of the output load driving device 1 illustrated in FIG. 4. In FIG. 6, the differential amplifier circuit 20 (20A, 20B) has a transfer function (namely, gain) K1, and the amplifying-stage differential amplifier circuit 24 (24A, 24B) has gain (1+(1/sCR)). Here, s is a Laplace transform parameter. The PWM comparators 26 (26A, 26B) has gain K2, and the gate driving circuit 4 (4A, 4B) and the output circuit 5 (5A, 5B) have combined gain K3. The smoothing circuit 22 (22A, 22B) has a transfer function (gain) 1/sCR. Since the output signal of the smoothing circuit 22 is supplied to the minus input in the amplifying-stage differential amplifier circuit, the sign of the gain becomes "−."

The transfer function T(s) of the entire class D amplifier circuit 2 (2A, 2B) illustrated in FIG. 6 is expressed by the following expression: $T(s)=K1 \cdot K2 \cdot K3 \cdot (s+(1/CR))/(s+(K2 \cdot K3/CR))$. The gain K2 is a coefficient determined by the peak value of the triangular-wave signal, and is given by a value of "output pulse width"/"input voltage."

The gain K3 of the output stage (the gate driving circuit 4 and the output circuit 5) is determined by the command values PWMIN1 and PWMIN2, and the output voltages PO(+) and PO(−) (the gain K3 is called hereafter the output-stage gain K3). Due to a dead time at the time of output switching, and due to a rise time and a fall time of the output voltage, the output pulse width (output voltage width) decreases when the input pulse width (pulse width of the command value) is small. The property of the output-stage gain K3 is illustrated in FIG. 7.

Figure 7:
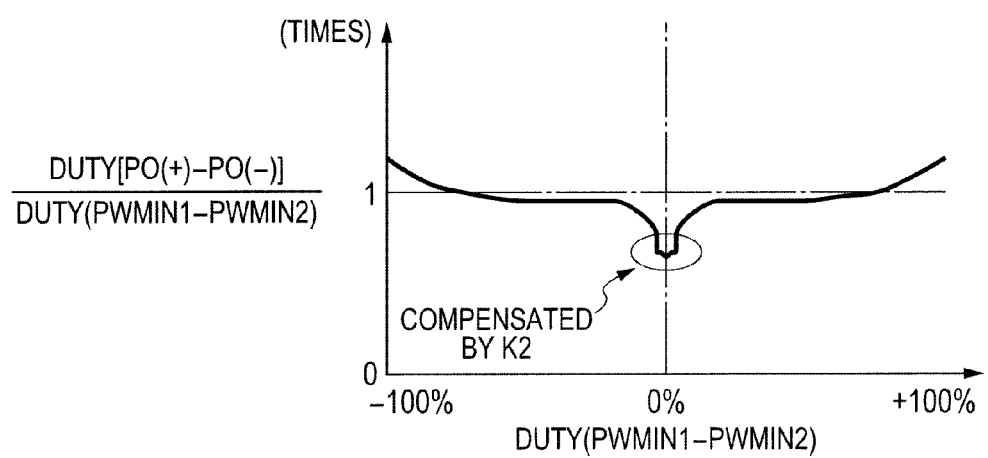
FIG. 7 is a drawing illustrating an input-output characteristic of the output circuit illustrated in FIG. 4.

In FIG. 7, the horizontal axis indicates a duty (DUTY) of a difference (PWMIN1−PWMIN2) of the command values PWMIN1 and PWMIN2, and the vertical axis indicates a ratio of the duty of the output voltage PO(+)−PO(−) to the duty of the difference of the command value. In FIG. 7, the duty +100% of the horizontal axis indicates a state where the difference command value PWMIN1−PWMIN2 is on H level, that is, a state where the command value PWMIN1 is H level, and the command value PWMIN2 is L level. The duty −100% indicates a state where the difference command value PWMIN1−PWMIN2 is L level, that is, a state where the command value PWMIN1 is L level and the command value PWMIN2 is H level. The duty 0% indicates a state where the command value PWMIN1 and the command value PWMIN2 are equal.

Namely, the vertical axis of FIG. 7 indicates the ratio of the driving pulse width between the output nodes PO(+) and PO(−) to the command values PWMIN1 and PWMIN2 of the gate driving circuit, when the amplitude of an alternating current component (AC component) of the input signal VIN is not zero. Under the influence of the dead time, the value on the vertical axis becomes the minimum when the duty of the command value PWMIN1−PWMIN2 is 0%, and the value approaches unity as the duty becomes large in both positive and negative polarities.

The area where the duty is near 0% corresponds to an area where the amplitude of the input signal VIN is small. In this area, under the influence of the dead time, the duty of the difference output voltage PO(+)−PO(−) becomes smaller than the duty of the difference command value PWMIN1−PWMIN2, and the difference with the command value becomes large. That is, the output-stage gain K3 becomes small in the area where the input signal VIN becomes near the reference voltage REF. This fact leads to the deterioration of the frequency characteristic of the output load driving device. In the present invention, in an area where the duty (PWMIN1−PWMIN2) is near 0%, the gain K2 of the PWM comparator 26 is adjusted so as to keep the product of the gain K2 and the gain K3, i.e., (K2·K3) in a fixed range; accordingly, decrease of the gain K3 is compensated.

Figure 8A:
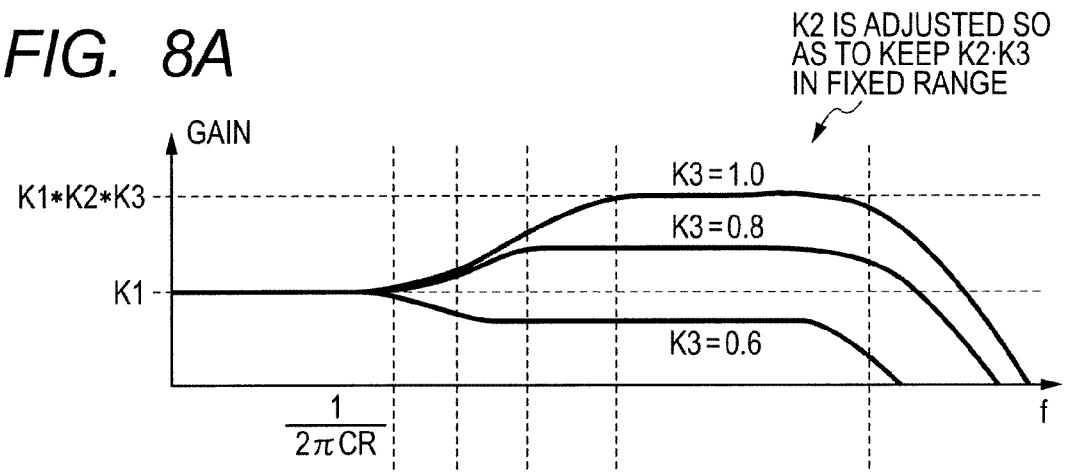
FIG. 8 (A) is a drawing illustrating a frequency characteristic of gain of the output load driving device illustrated in FIG. 4.
Figure 8B:
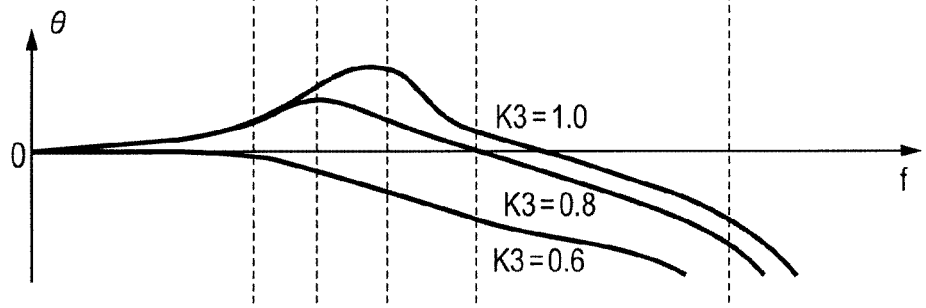

The frequency characteristics of the transfer function of the output load driving circuit are illustrated in FIG. 8 (A) and FIG. (B), with the output-stage gain K3 illustrated in FIG. 7 as a parameter. FIG. 8 (A) illustrates the frequency characteristics of the output load driving device, where the horizontal axis shows frequency f and the vertical axis shows gain (Gain). The maximum of the gain (Gain) is K1·K2·K3. In the horizontal axis, the frequency ½πCR is a cut-off frequency of the smoothing circuits 22A and 22B. In FIG. 8 (A), the frequency characteristics for the output-stage gain K3=1.0, 0.8, and 0.6 are illustrated as an example.

FIG. 8 (B) illustrates the frequency dependence of phase θ of the output voltage, where the horizontal axis shows frequency f and the vertical axis shows phase θ of the output voltage. Also in FIG. 8 (B), the frequency characteristics for the output-stage gain K3=1.0, 0.8, and 0.6 are illustrated.

As illustrated in FIG. 8 (A) and FIG. 8 (B), in an area up to the cut-off frequency ½πCR of the smoothing circuit, the output voltage corresponding to the command value is generated by feedback control, and the gain (Gain) is K1. Error of the phase θ of the output voltage is also small.

When the frequency exceeds the cut-off frequency, as the output-stage gain K3 becomes small, the gain decreases and the phase error increases, and the frequency characteristics in a high frequency region deteriorate. The output-stage gain K3 changes corresponding to the pulse width of the command value and the pulse width of the output signal. Therefore, in order to compensate the property degradation of the output-stage gain K3 in a high frequency region, the gain K2 of the PWM comparators 26A and 26B is adjusted to compensate for change of the output-stage gain K3. Thereby, the change of the frequency characteristic of a voltage-feedback class-D amplifier circuit is reduced, and a highly efficient output load driving device is realized.

The gain control described above is performed by the triangular-wave correction circuit 32 (refer to FIG. 4). In a correcting method of the triangular-wave signal, the frequency (PWM carrier frequency), the maximum voltage, and the minimum voltage of the triangular-wave need to be the same as those of the triangular wave which the triangular-wave signal generator 30 (refer to FIG. 4) generates. In the area where the frequency characteristic deteriorates, the slew rate of the triangular-wave signal is made small, and in other areas, the slew rate is made a little large in order to keep the triangular-wave frequency constant. Further, an average slew rate of the triangular wave from the maximum voltage to the minimum voltage is made the same as the slew rate of the triangular wave which the triangular-wave signal generator 30 generates. By making the slew rate of the triangular-wave signal small, the closed-loop frequency response can be made fast, and the response in the area where the response is otherwise deteriorated due to the dead time can be improved.

In the present case, the compensation amount to the output-stage gain K3 by the gain K2 can be changed continuously or discontinuously, within the allowable performance range of the frequency characteristic required by the output load driving device. Hereafter, a specific configuration of the triangular-wave signal generator 30 and the triangular-wave correction circuit 32 is explained.

Embodiment 1

Figure 9:
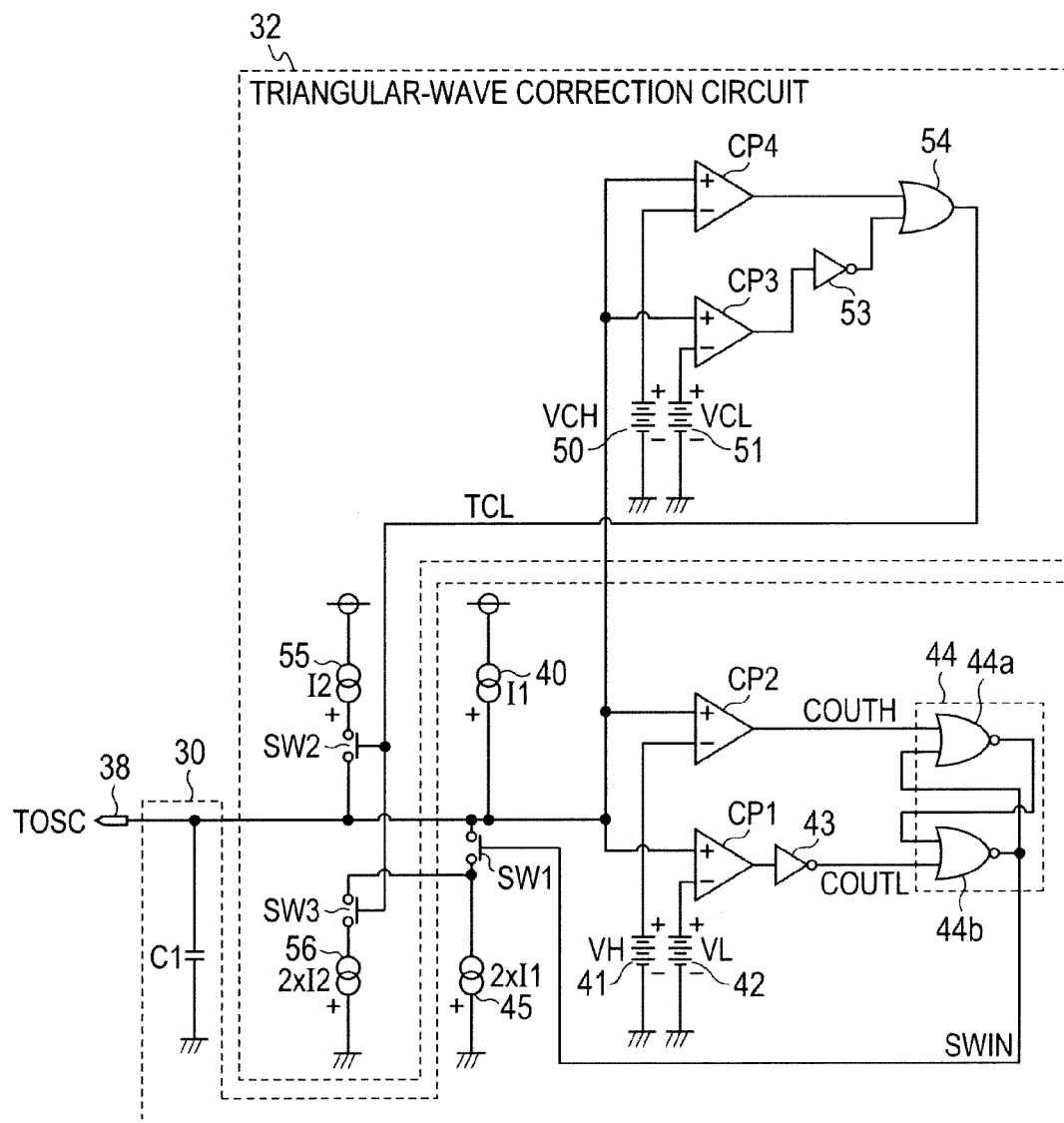
FIG. 9 is a drawing illustrating configuration of a triangular-wave signal generator and a triangular-wave correction circuit which are included in a voltage-feedback class-D amplifier circuit according to Embodiment 1 of the present invention.

FIG. 9 illustrates an example of a specific configuration of a triangular-wave signal generator 30 and a triangular-wave correction circuit 32 which are included in the output load driving device, according to Embodiment 1 of the present invention. In FIG. 9, the triangular-wave signal generator 30 includes a reference voltage source 41 which generates a reference voltage VH; a reference voltage source 42 which generates a reference voltage VL; a comparator CP2 which compares the triangular-wave signal TOSC of the output node 38 with the reference voltage VH of the reference voltage source 41; a comparator CP1 which compares the triangular-wave signal TOSC with the reference voltage VL of the reference voltage source 42; an inverter 43 which reverses an output signal of the comparator CP1; and a flip-flop circuit 44 which is set or reset according to an output signal COUTH of the comparator CP2 and an output signal COUTL of the inverter 43.

The reference voltages VH and VL set up a high-side peak value and a low-side peak value of the triangular-wave signal TOSC, respectively. The comparator CP1 outputs a signal of H level, when the triangular-wave signal TOSC is higher than the reference voltage VL. The comparator CP2 sets the output signal COUTH as H level, when the triangular-wave signal TOSC becomes higher than the reference voltage VH.

The flip-flop circuit 44 includes NOR gates 44a and 44b of which the first inputs and the outputs are crossover-coupled with each other. The NOR gate 44a receives the output signal COUTH of the comparator CP2 at the second input thereof, and the NOR gate 44b receives the output signal COUTL of the inverter 43 at the second input thereof. A switching control signal SWIN is generated from the NOR gate 44b.

The triangular-wave signal generator 30 further includes a constant current source 40 which supplies a constant current I1 to the output node; a constant current source 45 which passes a constant current 2·I1 to the ground node; and a switching circuit SW1 which is conducted selectively in response to the switching control signal SWIN and couples the constant current source 45 to the output node 38 at the time of conduction.

A capacitive element C1 is provided at the output node 38. By charging and discharging of the capacitive element C1, the level of a triangular-wave signal TOSC changes and the slew rate of the triangular-wave signal TOSC is determined. Hereafter, operation of the triangular-wave signal generator 30 is explained briefly.

When the voltage level of the triangular-wave signal TOSC falls and reaches the level of the reference voltage VL, the output signal of the comparator CP1 turns to L level, correspondingly, the output signal COUTL of the inverter 43 turns to H level, and the switching control signal SWIN from the NOR gate 44b of the flip-flop circuit 44 turns to L level. Correspondingly, the switching circuit SW1 becomes in a non-conductive state, and the constant current source 45 is separated from the output node 38. In the present state, the constant current source 40 supplies the charging current I1 to the capacitive element C1, and the voltage level of the triangular-wave signal TOSC rises at a slew rate (gradient) determined by the capacity value of the capacitive element C1 and the constant current I1.

When the voltage level of the triangular-wave signal TOSC becomes higher than the reference voltage VL, the output signal of the comparator CP1 turns to H level, and the output signal COUTL of the inverter 43 turns to L level. At this time, the triangular-wave signal TOSC is lower than the reference voltage VH, therefore, the comparator CP2 maintains the output signal COUTH on L level. In the present state, the output signal of the NOR gate 44a is H level, and the switching control signal SWIN from the NOR gate 44b is maintained on L level.

When the triangular-wave signal TOSC reaches the reference voltage VH, the output signal COUTH of the comparator CP2 turns to H level, and the output signal of the NOR gate 44a turns to L level. At this time, the triangular-wave signal TOSC is higher than the reference voltage VL, accordingly, the output signal of the comparator CP1 is H level, and the output signal COUTL of the inverter 43 is L level. Therefore, the switching control signal SWIN outputted by the NOR gate 44b of the flip-flop circuit 44 turns to H level, and the switching circuit SW1 becomes in a conductive state. Correspondingly, the constant current source 45 is coupled to the output node 38. A difference of the constant current I1 which is supplied by the constant current source 40 and the constant current 2·I1 which is discharged by the constant current source 45 is discharged from the output node 38; that is, the constant current I1 is discharged from the output node 38. Accordingly, the voltage level of the triangular-wave signal TOSC falls.

When the level of the triangular-wave signal TOSC becomes lower than the reference voltage VH, the output signal COUTH of the comparator CP2 turns to L level. At this time, the output signal of the comparator CP1 is H level, the output signal COUTL of the inverter 43 is L level, and the switching control signal SWIN is maintained on H level.

Therefore, the triangular-wave signal generator 30 discharges the current I1 from the output node 38 when the triangular-wave signal TOSC becomes lower than the level of the reference voltage VH, and charges the output node 38 by the constant current I1 when the triangular-wave signal TOSC reaches the reference voltage VL. The charge and discharge current for the capacitive element C1 is equal to the constant current I1. Accordingly, the triangular-wave signal generator 30 functions to change the waveform of the triangular-wave signal TOSC at the time of rising and falling, with the gradient (slew rate) which is determined by the capacitive element C1 and the constant current I1.

The triangular-wave correction circuit 32 includes a reference voltage source 50 which generates a reference voltage VCH; a reference voltage source 51 which generates a reference voltage VCL; a comparator CP3 which compares the triangular-wave signal TOSC of the output node 38 with the reference voltage VCL; a comparator CP4 which compares the triangular-wave signal TOSC with the reference voltage VCH; an inverter 53 which receives an output signal of the comparator CP3; and an OR gate 54 which receives an output signal of the inverter 53 and an output signal of the comparator CP4.

The reference voltage sources 50 and 51 generate respectively reference voltages VCH and VCL which satisfy a relation of VH>VCH>VCL>VL. The reference voltages VCH and VCL correspond to voltage levels of both sides of the central value VC of the wave height of the triangular-wave signal TOSC.

The comparator CP3 generates a signal of H level, when the triangular-wave signal TOSC is higher than the reference voltage VCL. The comparator CP4 generates a signal of H level, when the triangular-wave signal TOSC becomes higher than the reference voltage VCH.

The triangular-wave correction circuit 32 further includes a constant current source 55 which supplies a constant current I2; a switching circuit SW2 which is conducted selectively according to an output signal TCL of the OR gate 54; a constant current source 56 which discharges a constant current 2·I2; and a switching circuit SW3 which is conducted selectively according to the output signal TCL of the OR gate 54.

The switching circuit SW2 is conducted when the slew rate adjusting signal TCL outputted by the OR gate 54 is H level, and couples the constant current source 55 to the output node 38. The switching circuit SW3 is conducted when the slew rate adjusting signal TCL outputted by the OR gate 54 is H level, and couples the constant current source 56 to the switching circuit SW1 in parallel with the constant current source 45.

Figure 10:
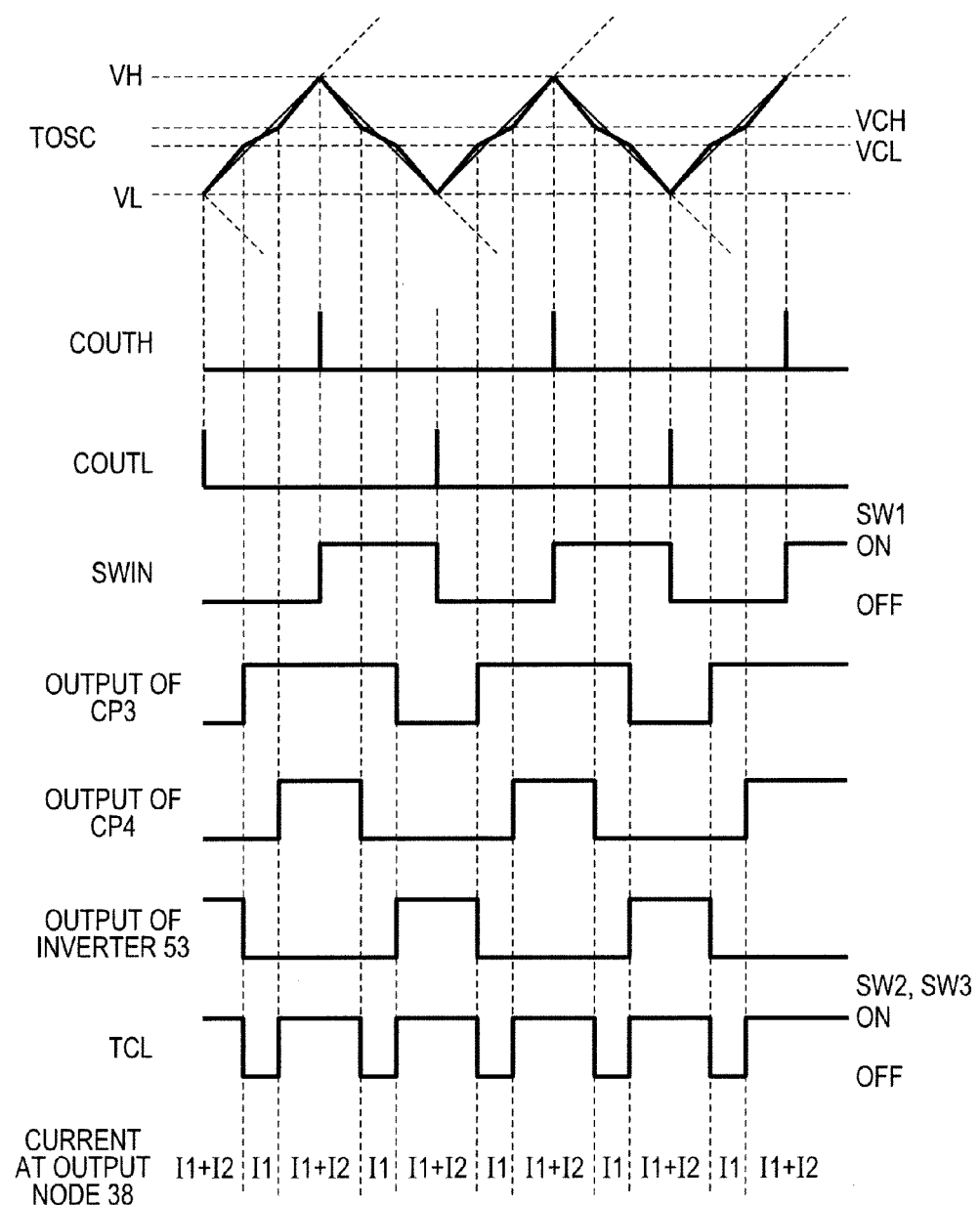
FIG. 10 is a timing chart illustrating operation of the circuit illustrated in FIG. 9.

FIG. 10 is a timing chart illustrating operation of the triangular-wave signal generator 30 and the triangular-wave correction circuit 32 which are illustrated in FIG. 9. Hereafter, with reference to FIG. 10, operation in adjusting the waveform of the triangular-wave signal TOSC is explained, focusing on the operation of the triangular-wave correction circuit 32.

In the triangular-wave signal generator 30, as described above, whenever the triangular-wave signal TOSC reaches the reference voltage VL, the flip-flop circuit 44 is reset, and the switching control signal SWIN is set as L level. Whenever the triangular-wave signal TOSC reaches the reference voltage VH, the flip-flop circuit 44 is set, and the switching control signal SWIN is set as H level. During the period that the switching control signal SWIN is on H level, the switching circuit SW1 is in a conductive state. Therefore, the triangular-wave signal generator 30 generates a triangular wave illustrated by a straight line in FIG. 10.

During the period that the triangular-wave signal TOSC is between the reference voltage VL and the reference voltage VCL, the output signal of the comparator CP3 is L level, and the output signal of the comparator CP4 is L level as well. The output signal of the inverter 53 turns to H level during the present period, and the slew rate adjusting signal TCL outputted by the OR gate 54 turns to H level; accordingly, the switching circuits SW2 and SW3 become in a conductive state (ON state). Since the switching circuit SW1 is in a non-conductive state (OFF state) at this time, the current is supplied to the output node 38 by the constant current sources 40 and 55, and the capacitive element C1 is charged by the current I1+I2. Accordingly, compared with a case where only the triangular-wave signal generator 30 is employed, the voltage level of the triangular-wave signal TOSC rises at a greater slew rate.

When the triangular-wave signal TOSC reaches the reference voltage VCL, the output signal of the comparator CP3 turns to H level, correspondingly, the output signal of the inverter 53 turns to L level. At this time, the output signal of the comparator CP4 is L level, and the output signal TCL of the OR gate 54 falls from H level to L level. Thereby, the switching circuits SW2 and SW3 are set to a non-conductive state. At this time, the switching control signal SWIN is L level, and the switching circuit SW1 is in a non-conductive state. Therefore, at this time, the constant current source 55 is separated from the output node 38, and only the current I1 from the constant current source 40 is supplied to the output node 38. Accordingly, the rate of rising (slew rate) of the voltage level of the triangular-wave signal TOSC becomes smaller than that of a case where only the triangular-wave signal generator 30 is employed.

When the triangular-wave signal TOSC reaches the reference voltage VCH, the output signal of the comparator CP4 turns to H level, and the slew rate adjusting signal TCL outputted by the OR gate 54 rises to H level. Correspondingly, the switching circuit SW2 turns to a conductive state. Since the switching circuit SW1 is in a non-conductive state, the capacitive element C1 is again charged by the sum I1+I2 of the currents I1 and I2 supplied from the constant current sources 40 and 55 respectively. Accordingly, the slew rate of the triangular-wave signal TOSC is increased.

When the triangular-wave signal TOSC reaches the reference voltage VH, the flip-flop circuit 44 of the triangular-wave signal generator 30 is set, and the switching control signal SWIN turns to H level. At this time, in the triangular-wave correction circuit 32, the output signals of the comparators CP3 and CP4 are both on H level; accordingly the slew rate adjusting signal TCL maintains H level. When the switching circuit SW1 turns to a conductive state in response to H level of the switching control signal SWIN, the constant current sources 45 and 56 are coupled to the output node 38. Therefore, the supply current to the output node 38 becomes the current (I1+I2)−(2·I1+2·I2)=−(I1+I2), and the voltage level of the triangular-wave signal TOSC falls in response to discharge of the capacitive element C1. In an area between the reference voltage VH and the reference voltage VCH, the charge current and the discharge current of the triangular-wave signal TOSC are same in magnitude, and the triangular-wave signal TOSC ascends and descends with the same gradient (slew rate).

In a period after the triangular-wave signal TOSC reaches the reference voltage VCH until it reaches the next reference voltage VCL, the output signal of the comparator CP4 is L level, and the output signal of the comparator CP3 is H level. The output signal of the inverter 53 turns to L level, the slew rate adjusting signal TCL from the OR gate 54 turns to L level again, and the switching circuits SW2 and SW3 are set to a non-conductive state. Therefore, the current I1 is drawn out from the capacitive element C1 by the constant current sources 40 and 45, and the gradient of the triangular-wave signal TOSC becomes gentle (the slew rate is reduced). Also in the area between the reference voltage VCH and the reference voltage VCL, the charge current and the discharge current for output node 38 is same in magnitude, and the triangular-wave signal TOSC changes at the same slew rate.

When the triangular-wave signal TOSC becomes lower than the reference voltage VCL, the output signal of the comparator CP3 turns to L level. At this time, the output signal of the comparator CP4 is L level, the signal TCL from the OR gate 54 turns to H level again in response to the H-level signal from the inverter 53; accordingly the switching circuits SW2 and SW3 are set to a conductive state. In this state, the capacitive element C1 is again discharged with the current (I1+I2), and the slew rate of the triangular-wave signal TOSC is increased. Also in the present voltage region, the charge current and the discharge current of the output node 38 are same in magnitude, and the triangular-wave signal TOSC changes at the same slew rate (gradient).

As described above, in the period that the triangular-wave signal TOSC is between the reference voltage VCL and the reference voltage VCH, the capacitive element C1 is charged or discharged by the current I1, and the slew rate of the triangular-wave signal TOSC is reduced. In the remaining voltage range, the capacitive element C1 is charged or discharged by the current (I1+I2), and the slew rate of the triangular-wave signal TOSC is increased.

As illustrated in FIG. 10, the frequency of the triangular-wave signal TOSC after adjustment is the same as that of the triangular wave signal which the triangular-wave signal generator 30 generates, and the maximum voltage VH and the minimum voltage VL of the triangular-wave signal TOSC after adjustment are the same as those of the triangular-wave signal which the triangular-wave signal generator 30 generates.

Figure 11:
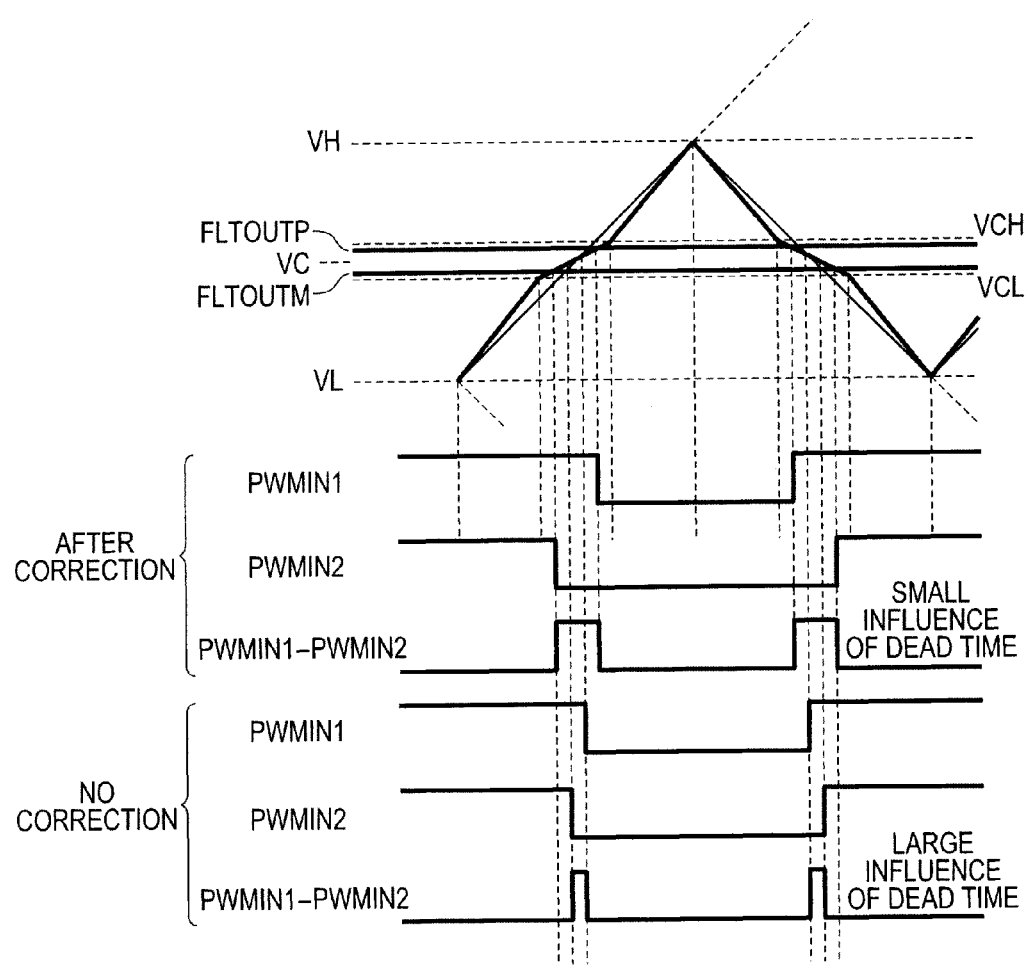
FIG. 11 is a timing chart illustrating operation of the circuit illustrated in FIG. 9 when a difference of an input signal and a reference voltage is small.

FIG. 11 exemplifies an enlarged waveform of the output voltages PO(+) and PO(−), in a case of employing the triangular-wave signal generator 30 and the triangular-wave correction circuit 32 illustrated in FIG. 9. Hereafter, the effect of the triangular-wave correction is explained with reference to FIG. 11.

Now, consider a state where the output signals FLTOUTP and FLTOUTM of the amplifying-stage differential amplifier circuits 24A and 24B are between the reference voltage VCH and the reference voltage VCL, respectively, and the voltage level of the output signal FLTOUTP is higher than that of the output signal FLTOUTM, as illustrated in FIG. 11. After the output signals FLTOUTP and FLTOUTM are compared with the triangular-wave signal TOSC, command values PWMIN1 and PWMIN2 for the gate driving circuits 4A and 4B illustrated in FIG. 4 are generated.

When the triangular-wave correction circuit 32 is employed, the command value PWMIN1 is set as H level when the voltage level of the output signal FLTOUTP is higher than that of the triangular-wave signal TOSC, and the command value PWMIN2 is set as H level when the voltage level of the output signal FLTOUTM is higher than that of the triangular wave TOSC. According to these command values PWMIN1 and PWMIN2, the output voltages PO(+) and PO(−) are generated in consideration of a dead time.

When utilizing the triangular-wave correction circuit 32, the L-level period of the command value PWMIN1 becomes shorter compared with a case of no correction for the triangular-wave slew rate, and the L-level period of the command value PWMIN2 becomes longer compared with a case of no correction. Therefore, the H-level period of the difference command value PWMIN1−PWMIN2 becomes longer (the pulse width is enlarged), and the gain K2 of the PWM comparator is increased.

The dead time is the same irrespective of correction or no correction, and the pulse width of the difference output voltage PO(+)−PO(−) with correction becomes wider compared with the pulse width of the difference output voltage PO(+)−PO(−) with no correction.

Since the gain K2 of the PWM comparator 26 illustrated in FIG. 6 is given by a ratio of the output pulse width to the input voltage, the gain K2 at the time of using the triangular-wave correction circuit 32 is improved compared with the gain K2 at the time of performing no correction in the triangular-wave slew rate by the triangular-wave correction circuit 32. Namely, by reducing the slew rate of the triangular-wave signal TOSC in an area near the center value VC where the frequency characteristic deteriorates, it is possible to enlarge the pulse width of the difference output voltage PO(+)−PO(−) to increase the gain K2 of the PWM comparator 26; accordingly it is possible to compensate for the decrease of the output-stage gain K3. Thereby, even when there is a dead time of a fixed time, a sufficient pulse width of the output driving voltage can be secured, the output voltage corresponding to the command value can be generated by the feedback control, and degradation of the frequency characteristics can be suppressed.

In Embodiment 1 of the present invention, a slew rate adjusting area is set in a region near the central voltage VC of the triangular-wave which corresponds to an area where the difference voltage between the input voltage VIN and the reference voltage REF is small, and where degradation of the frequency characteristic resulting from a dead time appears most notably. In the region between the reference voltage VCH and the reference voltage VCL, the slew rate of the triangular-wave signal is reduced, compared with an average slew rate of a waveform of the triangular-wave signal which goes from a high-side peak value VH to a low-side peak value VL and an average slew rate of a waveform of the triangular-wave signal which goes from the low-side peak value VL to the high-side peak value VH. Accordingly, the frequency response of the output load driving device can be compensated with the performance practically equal to that in other areas, and the output load can be driven with a high degree of preciseness, corresponding to the command value.

(Specific Configuration)

Figure 12:
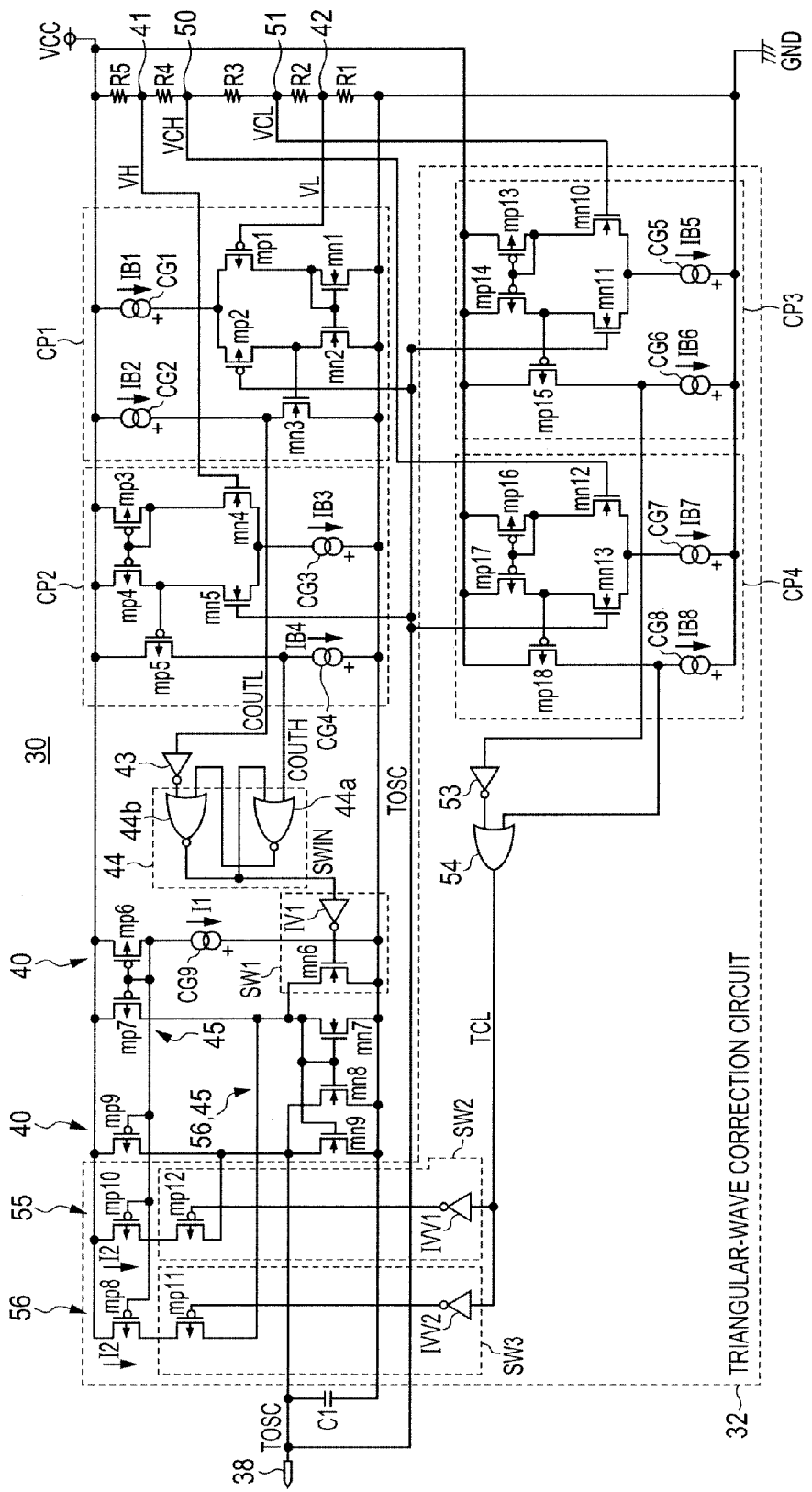
FIG. 12 is a drawing illustrating an example of a specific configuration of the circuit illustrated in FIG. 9.

FIG. 12 illustrates an example of specific configuration of the triangular-wave signal generator 30 and the triangular-wave correction circuit 32, illustrated in FIG. 9.

The reference voltages VH, VCH, VCL, and VL are generated by a resistive subdivision circuit comprised of resistive elements R1-R5. A connection node between the resistive elements R4 and R5 corresponds to the reference voltage source 41, and outputs the reference voltage VH. A connection node between the resistive elements R3 and R4 corresponds to the reference voltage source 50, and outputs the reference voltage VCH. A connection node between the resistive elements R3 and R2 corresponds to the reference voltage source 51, and outputs the reference voltage VCL. A connection node between the resistive elements R2 and R1 corresponds to the reference voltage source 42, and outputs the reference voltage VL. Influence of variation of the reference voltages VH, VCH, VCL, and VL (the variation which originates in change of power supply voltage VCC and temperature) is offset by composing the reference voltage sources 41, 50, 51, and 42 from one resistive subdivision circuit.

The comparator CP1 includes constant current sources CG1 and CG2; P-channel MOS transistors mp1 and mp2 which form a comparison stage for comparing the triangular-wave signal TOSC with the reference voltage VL; N-channel MOS transistors mn1 and mn2 which form a current mirror stage; and N-channel MOS transistor mn3 which receives a drain voltage of MOS transistors mp2 and mn2 at the gate thereof.

The constant current sources CG1 and CG2 supply constant currents IB1 and IB2 from a power node (VCC), respectively. The MOS transistors mp1 and mp2 are supplied with current from the constant current source CG1, and receive the reference voltage VL and the triangular-wave signal TOSC at each gate. The MOS transistor mn1 is coupled in series with the MOS transistor mp1, has a drain and a gate which are intercoupled with each other, and configures a master of the current mirror stage. The MOS transistor mn2 is coupled in series with the MOS transistor mp2, and has a gate which is coupled to the gate of the MOS transistor mn1. The MOS transistor mn3 discharges the constant current IB2 from the constant current source CG2 to a ground node (GND) when conducted.

In the comparator CP1, when the triangular-wave signal TOSC is higher than the reference voltage VL, a current which flows through the MOS transistor mp1 increases more than a current which flows through the MOS transistor mp2. A mirror current of a current which flows through the MOS transistor mp1 flows through the MOS transistor mn2. This mirror current is larger than the current which MOS transistor mp2 supplies. Therefore, a gate voltage of the MOS transistor mn3 turns to L level, and the MOS transistor mn3 becomes in OFF state. Accordingly, the output signal COUTL of the comparator CP1 turns to H level.

When the triangular-wave signal TOSC is lower than the reference voltage VL, on the other hand, the current which flows through the MOS transistor mp2 becomes larger than the current which flows through the MOS transistor mp1. The current which the MOS transistor mn2 discharges is smaller than the current which the MOS transistor mp2 supplies. Therefore, the gate voltage of the MOS transistor mn3 turns to H level, and the constant current IB2 from the constant current source CG2 is discharged through the MOS transistor mn3. Accordingly, the output signal COUTL of the comparator CP1 turns to L level.

The comparator CP2 includes P-channel MOS transistors mp3 and mp4 which are coupled with the power node and form a current mirror stage; N-channel MOS transistors mn4 and mn5 which form a differential stage for comparing the triangular-wave signal TOSC with the reference voltage VH; constant current sources CG3 and CG4; and a P-channel MOS transistor mp5 which supplies a current to the constant current source CG4.

The MOS transistor mp3 has a gate and a drain which are intercoupled with each other and functions as a master of the current mirror stage. A mirror current of the current which flows through the MOS transistor mp3 flows through the MOS transistor mp4.

The constant current source CG3 is coupled between the ground node and a common source node of the MOS transistors mn4 and mn5, and discharges a constant current IB3 to the ground node. The constant current source CG4 is coupled between the MOS transistor mp5 and the ground node, and discharges a constant current IB4 to the ground node.

In the comparator CP2, when the triangular-wave signal TOSC becomes higher than the reference voltage VH, the conductance of the MOS transistor mn5 becomes greater than the conductance of the MOS transistor mn4, and the MOS transistor mn5 discharges a current which flows through the MOS transistor mp4 (the mirror current of the current which flows through the MOS transistor mp3). Correspondingly, a gate voltage of the MOS transistor mp5 turns to L level, and the MOS transistor mp5 supplies a large mount of current to the constant current source CG4. Accordingly, an output signal COUTH of the comparator CP2 turns to H level.

When the triangular-wave signal TOSC is lower than the reference voltage VH, the conductance of the MOS transistor mn5 becomes smaller than the conductance of the MOS transistor mn4, and a current smaller than the current supplied from the MOS transistor mp4 is discharged through the MOS transistor mn5. Correspondingly, the gate voltage of the MOS transistor mp5 rises, and the current which the MOS transistor mp5 passes becomes smaller than the constant current IB4 which the constant current source CG4 supplies. Accordingly, the output signal COUTH of the comparator CP2 turns to L level.

The flip-flop circuit 44 illustrated here has, as an example, the configuration of an NOR type flip-flop, same as in the configuration illustrated in FIG. 9. The flip-flop circuit 44 is realizable similarly, even when NAND gates are used.

The flip-flop circuit 44 includes NOR gates 44a and 44b of which the first inputs and the outputs are crossover-coupled with each other, as well as the configuration illustrated in FIG. 9. An inverter 43 which reverses the output signal COUTL of the comparator CP1 is provided to the NOR gate 44b of the flip-flop circuit 44. The NOR gate 44a receives the output signal COUTH of the comparator CP2 at the second input thereof, and the NOR gate 44b receives an output signal of the inverter 43 at the second input thereof. A switching control signal SWIN is generated by the NOR gate 44b.

When the output signal COUTL of the comparator CP1 turns to L level (i.e., when the triangular-wave signal TOSC reaches the reference voltage VL), the output signal of the inverter 43 turns to H level, and the output signal of the NOR gate 44b turns to L level in the flip-flop circuit 44. At this time, the voltage level of the triangular-wave signal TOSC is lower than the reference voltage VH, the output signal COUTH of the comparator CP2 is L level. Therefore, the switching control signal SWIN outputted from the NOR gate 44b becomes L level.

On the other hand, when the output signal COUTL of the comparator CP1 turns to H level and the output signal COUTH of the comparator CP2 turns to H level (i.e., when the triangular-wave signal TOSC reaches the reference voltage VH), the output signal of the inverter 43 turns to L level, the output signal of the NOR gate 44a turns to L level, and the switching control signal SWIN turns to H level.

When the triangular-wave signal TOSC has a level between the reference voltage VH and the reference voltage VL, the output signal COUTL of the comparator CP1 is H level, the output signal COUTH of the comparator CP2 is L level, and the output signal of the inverter 43 is L level. Therefore, the flip-flop circuit 44 is maintained in the previous state of set or reset, and the switching control signal SWIN maintains the present logical level until the triangular-wave signal TOSC reaches the reference voltage VH or the reference voltage VL.

The constant current source 40 illustrated in FIG. 9 is comprised of a constant current source CG9 and P-channel MOS transistors mp6 and mp9. The constant current source 45 is comprised of N-channel MOS transistors mn7-mn9, the constant current source CG9, and a P-channel MOS transistor mp7. These constant current sources 40 and 45 share common parts of the components, accordingly the circuit layout area is reduced as much.

The constant current source CG9 draws out a constant current I1 from the MOS transistor mp6, accordingly, the constant current I1 flows through the MOS transistor mp6. The MOS transistors mp6 and mp9 form a current mirror circuit, a mirror current of the constant current I1 which flows through the MOS transistor mp6 flows through the MOS transistor mp9, and the constant current I1 is supplied to the output node 38.

The switching circuit SW1 includes an inverter IV1 which receives the switching control signal SWIN, and an N-channel MOS transistor mn6 which receive an output signal of the inverter IV1 at the gate thereof. The constant current source 45 corresponds to the N-channel MOS transistors mn7-mn9 and the P-channel MOS transistor mp7. The MOS transistor mn7 has a gate and a drain which are intercoupled with each other, and discharges a current supplied from the MOS transistor mp7. The MOS transistors mn8 and mn9 form a current mirror circuit with the MOS transistor mn7 and pass a current of the same magnitude as the current which flows through the MOS transistor mn7.

When the switching control signal SWIN is L level and the output signal of the inverter IV1 is H level, the MOS transistor mn6 turns to ON state, the switching circuit SW1 is set to a non-conductive state equivalently, and the constant current source 45 is separated from the output node 38 (since the gate voltage of the MOS transistors mn7-mn9 is set as the ground voltage level and the current mirror operation is disenabled).

When the switching control signal SWIN is H level and the MOS transistor mn6 is in OFF state, the switching circuit SW1 is set to a conductive state equivalently, and the current source 45 is coupled to the output node 38. In this state, the mirror current of the current which flows through the MOS transistor mn7 flows through the MOS transistors mn8 and mn9. The constant current I1 is supplied to the MOS transistor mn7 from the MOS transistor mp7 by the current mirror operation. Therefore, when the correction operation of the triangular-wave slew rate is not performed, the current of 2·I1 is drawn out from the output node 38 by the constant current source 45.

In the triangular-wave correction circuit 32, the comparator CP3 includes P-channel MOS transistors mp13 and mp14 which are coupled to the power node and configure a current mirror stage; N-channel MOS transistors mn10 and mn11 which form a differential stage for comparing the triangular-wave signal TOSC with the reference voltage VCL; constant current sources CG5 and CG6; and a P-channel MOS transistor mp15 having a gate which is coupled to drains of the MOS transistors mp14 and mn11.

The MOS transistor mp13 has a gate and a drain which are intercoupled with each other, and functions as a master of the current mirror stage. A mirror current which flows through the MOS transistor mp13 flows through the MOS transistor mp14.

The constant current source CG5 is coupled between the ground node and a common source node of the MOS transistors mn10 and mn11, and discharges a constant current IB5 to the ground node GND. The MOS transistor mp15 is coupled between the constant current source CG6 and the power node. The constant current source CG6 draws out the constant current IB6 from the MOS transistor mp15.

In the comparator CP3, when the triangular-wave signal TOSC is lower than the reference voltage VCL, conductance of the MOS transistor mn10 becomes greater than conductance of the MOS transistor mn11, and the MOS transistor mn11 passes a current smaller than the mirror current of the current which the MOS transistor mp13 supplies. Correspondingly, a gate voltage of the MOS transistor mp15 rises and an output signal of the comparator CP3 turns to L level.

When the triangular-wave signal TOSC is higher than the reference voltage VCL, on the other hand, the conductance of the MOS transistor mn10 becomes smaller than the conductance of the MOS transistor mn11. Accordingly, the current which flows through the MOS transistor mn11 becomes greater than the current supplied from the MOS transistor mp14, and the gate voltage of the MOS transistor mp15 falls. The current which the MOS transistor mp15 passes from the power node VCC becomes greater than the current which the constant current source CG6 can supply, accordingly, the output signal of the comparator CP3 turns to H level.

The comparator CP4 includes P-channel MOS transistors mp16 and mp17 which are coupled to the power node and form a current mirror stage; N-channel MOS transistors mn12 and mn13 which form a differential stage for comparing the triangular-wave signal TOSC with the reference voltage VCH; constant current sources CG7 and CG8; and a P-channel MOS transistor mp18 of which the gate is coupled to drains of the MOS transistors mp17 and mn13.

The MOS transistor mp16 has a gate and a drain which are intercoupled with each other, and operates as a master of the current mirror stage. A mirror current of a current which flows through the MOS transistor mp16 flows through the MOS transistor mp17.

The constant current source CG7 is coupled between the ground node and a common source node of the MOS transistors mn12 and mn13, and discharges the constant current IB7 to the ground node.

The MOS transistor mp18 is coupled between the constant current source CG8 and the power nodes VCC. A gate of the MOS transistor mp18 is coupled to a drain of the MOS transistor mp17. The constant current source CG8 draws out the constant current IB8 from the MOS transistor mp18 and discharges it to the ground node.

In the comparator CP4, when the triangular-wave signal TOSC is lower than the reference voltage VCH, conductance of the MOS transistor mn12 becomes greater than conductance of the MOS transistor mn13, and the MOS transistor mn13 passes a current smaller than a current supplied through the MOS transistor mp17. Correspondingly, a gate voltage of the MOS transistor mp18 rises, and the MOS transistor mp18 can not supply a current greater than the constant current IB8 to the constant current source CG8. Accordingly, an output signal of the comparator CP4 turns to L level.

On the other hand, when the triangular-wave signal TOSC is higher than the reference voltage VCH, the conductance of the MOS transistor mn13 becomes greater than the conductance of the MOS transistor mn12 conversely. Correspondingly, a current which flows through the MOS transistor mn13 becomes greater than a current which is supplied from the MOS transistor mp17 as the mirror current of a current which flows through the MOS transistor mn12. Correspondingly, the gate voltage of the MOS transistor mp18 falls, and the current supplied by the MOS transistor mp18 becomes greater than the constant current IB8 which is driven by the constant current source CG8. Accordingly, the output signal of the comparator CP4 turns to H level.

In the triangular-wave correction circuit 32, logic of the comparators CP3 and CP4 is the same as that of the comparators CP3 and CP4 illustrated in FIG. 9, therefore, an inverter 53 and an OR gate 54 (refer to FIG. 9) are provided in the portion which generates the slew rate adjusting signal TCL for the following stage. The inverter 53 illustrated in FIG. 12 corresponds to the inverter 53 illustrated in FIG. 9, and reverses the output signal of the comparator CP3. The OR gate 54 receives an output signal of the inverter 53 and the output signal of the comparator CP4.

When the triangular-wave signal TOSC is lower than the reference voltage VCL, the output signal of the comparator CP3 turns to L level, and the output signal of the inverter 53 turns to H level. The output signal of the comparator CP4 is L level. Therefore, the slew rate adjusting signal TCL outputted by the OR gate 54 turns to H level. On the other hand, when the triangular-wave signal TOSC has a level between the reference voltage VCH and the reference voltage VCL, the output signal of the comparator CP3 is H level, the output signal of the inverter 53 is L level, and the output signal of the comparator CP4 is L level. Therefore, the slew rate adjusting signal TCL outputted by the OR gate 54 turns to L level.

In the triangular-wave correction circuit 32, constant current sources 55 and 56 are comprised of P-channel MOS transistors mp10 and mp8, respectively. These MOS transistors mp10 and mp8 form a current mirror circuit with the MOS transistor mp6 and supply the mirror current I2 of the current I1 which the constant current source CG9 supplies.

The switching circuit SW2 includes an inverter IVV1 which receives the slew rate adjusting signal TCL; and a P-channel MOS transistor mp12 which is coupled between the MOS transistor mp10 and the output node 38, and which has a gate for receiving an output signal of the inverter IVV1.

The switching circuit SW3 includes an inverter IVV2 which receives the slew rate adjusting signal TCL; and a P-channel MOS transistor mp11 which is coupled between the MOS transistor mp8 and the gate and drain of the MOS transistor mn7, and which has a gate for receiving an output signal of the inverter IVV2.

In the switching circuits SW2 and SW3, when the slew rate adjusting signal TCL is L level, the MOS transistors mp12 and mp11 become in OFF state and the supply of the charging current I2 to the output node 38 and the supply of the current I2 to the MOS transistor mn7 are both suspended. A period during which the slew rate adjusting signal TCL is L level corresponds to a period during which the triangular-wave signal TOSC is between the reference voltage VCH and the reference voltage VCL. Therefore, the capacitive element C1 is charged or discharged by the constant current I1 in the present case.

In a region where the triangular-wave signal TOSC is lower than the reference voltage VCL or higher than the reference voltage VCH, the slew rate adjusting signal TCL is H level. In the switching circuits SW2 and SW3, the output signals of the inverters IVV1 and IVV2 turn to L level, and the MOS transistors mp12 and mp11 become in ON state. Correspondingly, the constant current I2 from the MOS transistor mp10 is supplied to the output node 38, and, in addition to the constant current I1 supplied from the MOS transistor mp7, the constant current I2 from the MOS transistor mp8 is supplied to the drain of the MOS transistor mn7.

In the present voltage region, at the time of rising of the triangular-wave signal TOSC, the capacitive element C1 is charged by the current I1+I2, and at the time of falling of the triangular-wave signal TOSC, the capacitive element C1 is discharged by the current of I1+I2 (=2·I1+2·I2−I1−I2), because the MOS transistor mn7 passes the current I1+I2.

By utilizing the circuit configuration illustrated in FIG. 12, the triangular-wave correction circuit 32 illustrated in FIG. 9 can be realized.

As described above, according to Embodiment 1 of the present invention, the slew rate of the triangular-wave signal TOSC is reduced in the area at which the frequency characteristic deteriorates. Thereby, the degradation of the frequency characteristic can be suppressed and a highly efficient output load driving device can be realized.

Embodiment 2

Figure 13:
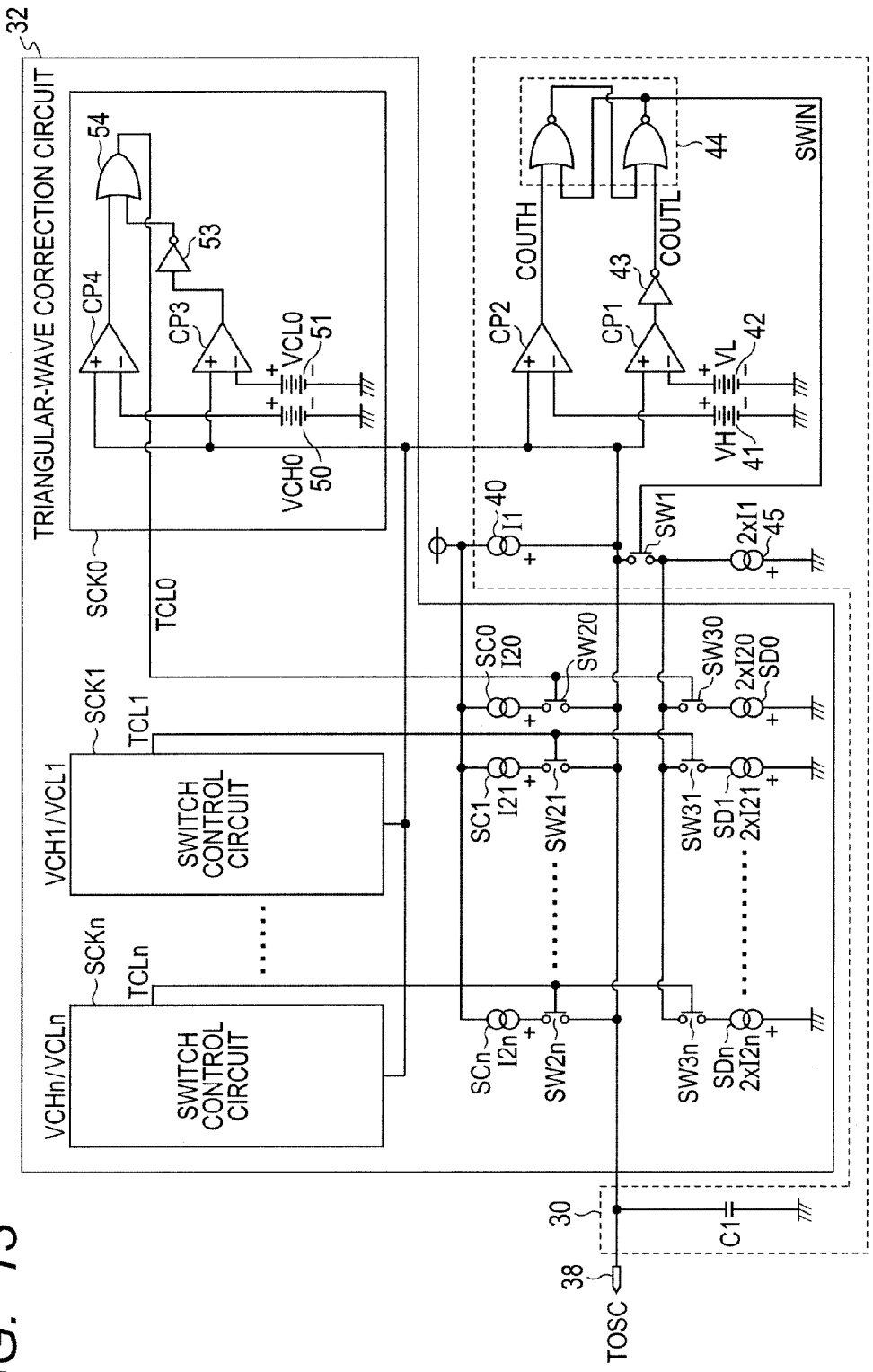
FIG. 13 is a drawing illustrating configuration of a triangular-wave signal generator and a triangular-wave correction circuit which are included in a voltage-feedback class-D amplifier circuit according to Embodiment 2 of the present invention.

FIG. 13 illustrates roughly configuration of a triangular-wave signal generator 30 and a triangular-wave correction circuit 32 of an output load driving device according to Embodiment 2 of the present invention. The configuration of the other part of the output load driving device illustrated in FIG. 13 is the same as the configuration illustrated in FIG. 4.

In FIG. 13, the triangular-wave signal generator 30 includes reference voltage sources 41 and 42; comparators CP1 and CP2; a set/reset flip-flop circuit 44; a switching circuit SW1; a constant current source 45; and a capacitive element C1, as well as the configuration previously illustrated in Embodiment 1. The configuration and operation of the triangular-wave signal generator 30 are the same as the configuration and operation which have been explained with reference to FIG. 9 in Embodiment 1, therefore, the detailed explanation thereof is not repeated.

In the triangular-wave correction circuit 32, switch control circuits SCK0-SCKn are provided in parallel to the output node 38. These switch control circuits SCK0-SCKn have the same internal configuration except that the reference voltage level for comparison is different. Therefore, in FIG. 13, the configuration of the switch control circuit SCK0 is illustrated typically.

The switch control circuit SCK0 includes reference voltage sources 50 and 51 which generate the reference voltages VCH0 and VCL0 for specifying a slew rate adjustable range; a comparator CP4 which compares the triangular-wave signal TOSC with the reference voltage VCH0; a comparator CP3 which compares the triangular-wave signal TOSC with the reference voltage VCL0; an inverter 53 which reverses an output signal of the comparator CP3; and an OR gate 54 which generates a slew rate adjusting signal TCL0 in response to an output signal of the inverter 53 and an output signal of the comparator CP4. The configuration of the switch control circuit SCK0 is the same as that of a portion which generates the slew rate adjusting signal TCL of the triangular-wave correction circuit previously illustrated in FIG. 9.

In the switch control circuits SCK0-SCKn, the reference voltages which the respective reference voltage sources 50 and 51 generate are set as constant voltages (VCH1 and VCL1)-(VCHn and VCLn), respectively.

The triangular-wave correction circuit 32 includes further constant current sources SC0, SC1 . . . SCn which are coupled with the power node and supply constant currents I20, I21, . . . I2n, respectively; switching circuits SW20-SW2n which are coupled between the output node 38 and the constant current sources SC0-SCn; constant current sources SD0-SDn which supply constant currents 2·I20, 2·I21 . . . 2·I2n, respectively; and switching circuits SW30-SW3n which are coupled between the switching circuit SW1 and the constant current sources SD0-SDn, respectively.

The constant current sources SC0-SCn and the switching circuits SW20-SW2n are provided corresponding to the switch control circuits SCK0-SCKn, respectively, and the constant current sources SD0-SDn and the switching circuits SW30-SW3n are also provided corresponding to the switch control circuits SCK0-SCKn, respectively. The switching circuits SW2i and SW3i turn to ON state (conductive state) selectively, according to the slew rate adjusting signal TLCi from the switch control circuit SCKi.

The operation of the switch control circuits SCK0-SCKn illustrated in FIG. 13 is the same as that of the triangular-wave correction circuit previously illustrated in Embodiment 1. That is, when the voltage level of the triangular-wave signal TOSC is between the reference voltage VCHi and the reference voltage VCLi which are assigned respectively, the corresponding switching circuits SW2i and SW3i are set to a non-conductive state. On the other hand, when the voltage level of the triangular-wave signal TOSC is out of the assigned range of the reference voltage VCHi and the reference voltage VCLi, the switch control circuit SCKi sets the corresponding switching circuits SW2i and SW3i to a conductive state. Thereby, it is possible to adjust the slew rate of the triangular-wave signal in (n+1) steps and to adjust the frequency characteristic more finely.

Figure 14:
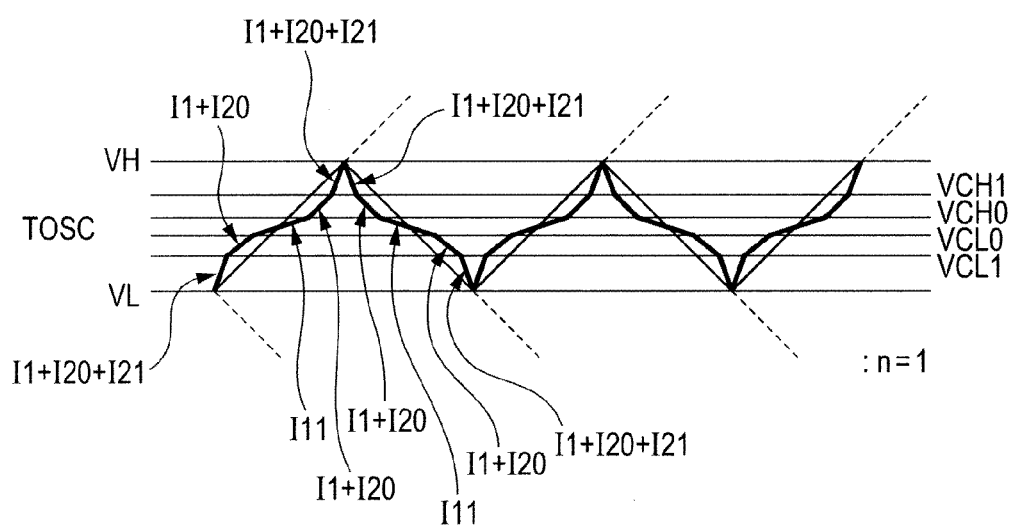
FIG. 14 is a signal waveform illustrating operation of the circuit illustrated in FIG. 13.

FIG. 14 is a wave form chart illustrating the operation of the triangular-wave signal generator 30 and the triangular-wave correction circuit 32, illustrated in FIG. 13. FIG. 14 corresponds to a case of n=1 and illustrates a waveform of the triangular-wave signal TOSC when the triangular-wave control circuits SCK0 and SCK1 are used. Hereafter, with reference to FIG. 14, operation of wave correction is explained for the case where the switch control circuits SCK0 and SCK1 are provided in the triangular-wave correction circuit 32.

The operation of the triangular-wave signal generator 30 is the same as the case of Embodiment 1. When the triangular-wave signal TOSC is higher than the reference voltage VL, the current I1 is supplied to the capacitive element C1 from the constant current source 40, and when the triangular-wave signal TOSC reaches the reference voltage VH, the switching circuit SW1 is set to a conductive state and the constant current I1 is discharged from the output node 38 to the ground node.

When the triangular-wave signal TOSC is between the reference voltage VCL1 and the reference voltage VL, the switching circuits (SW20, SW30) and (SW21, SW31) turn to a conductive state, according to the slew rate adjusting signals TCL0 and TCL1, and the constant currents I1, I20, and I21 are supplied from the constant current sources 40, SC0, and SC1 to the output node 38, and the capacitive element C1 is charged. According to the charge of the capacitive element C1, the voltage level of the triangular-wave signal TOSC rises at the greatest slew rate.

When the triangular-wave signal TOSC is between the reference voltage VCL0 and the reference voltage VCL1, the slew rate adjusting signal TCL1 of the switch control circuit SCK1 is deactivated, and the switching circuits SW21 and SW31 are set to a non-conductive state. On the other hand, the switching circuits SW20 and SW30 are in a conductive state according to the slew rate adjusting signal TCL0 from the switch control circuit SCK0. Therefore, in the present voltage range, the currents I1 and I20 are supplied to the output node 38 by the constant current sources 40 and SC0, and the slew rate of the triangular-wave signal TOSC is made somewhat small.

When the voltage level of the triangular-wave signal TOSC is between the reference voltage VCH0 and the reference voltage VCL0, the slew rate adjusting signals TCL0 and TCL1 are deactivated, and all of the switching circuits SW20, SW30, SW21, and SW31 are set to a non-conductive state. In the present case, only the current I1 from the constant current source 40 is supplied to the output node 38, and the slew rate of the triangular-wave signal TOSC becomes the smallest.

When the voltage level of the triangular-wave signal TOSC is between the reference voltage VCH0 and the reference voltage VCH1, the slew rate adjusting signal TCL0 is activated (H level), and the slew rate adjusting signal TCL1 from the switch control circuit SCK1 is deactivated (L level). Therefore, the switching circuits SW20 and SW30 are set to a conductive state, the currents I1 and I20 from the constant current sources 40 and SC0 are supplied to the output node 38, and the slew rate of the triangular-wave signal TOSC is increased.

When the triangular-wave signal TOSC is between the reference voltage VH and the reference voltage VCH1, the slew rate adjusting signals TCL0 and TCL1 from the switch control circuits SCK0 and SCK1 are all activated, and all of the switching circuit SW20, SW30, SW21, and SW31 are set to a conductive state. In the present case, the currents I1, I20, and I21 are supplied from the constant current sources 40, SC0, and SC1, and the slew rate of the triangular-wave signal TOSC becomes the highest again.

When the triangular-wave signal TOSC reaches the reference voltage VH, the switching control signal SWIN from the flip-flop circuit 44 is set to a set state, and the switching circuit SW1 becomes in a conductive state. The constant current sources 45, ST0-STn supply, respectively twice as many current $2 \cdot I1$, $2 \cdot I20$–$2 \cdot I2n$ as the current I1, I20-I2n which the corresponding constant current sources 40, SC0-SCn supply. Therefore, at the time of falling of the triangular-wave signal TOSC, the conduction control of the switching circuits is performed as well as the time of rising of the triangular-wave signal TOSC. Therefore, corresponding to the voltage range of the triangular-wave signal, the corresponding switching circuits SW30 and SW31 are set to a conductive state, and twice as many current as the current supplied by the constant current sources SC0-SC1 is drawn out from the output node 38 by the constant current sources SD0 and SD1.

Therefore, at the time of falling, when the triangular-wave signal TOSC is in a region between the reference voltage VH and the reference voltage VCH1, the capacitive element C1 at the output node 38 is discharged by the current I1+I20+I21; in a region between the reference voltage VCH1 and the reference voltage VCH0, the capacitive element C1 is discharged by the current I1+I20; in a region between the reference voltage VCH0 and the reference voltage VCL0, the capacitive element C1 is discharged by the current I1; in a region between the reference voltage VCL0 and the reference voltage VCL1, the capacitive element C1 is discharged by the current I1+I20; and in a region between the reference voltage VCL1 and the reference voltage VL, the capacitive element C1 is discharged by the current I1+I20+I21.

When the triangular-wave signal TOSC reaches the reference voltage VL, the flip-flop circuit 44 is reset again, the switching control signal SWIN turns to L level, the switching circuit SW1 is set to a non-conductive state, and charging operation to the output node 38 is started.

According to Embodiment 2 of the present invention, the slew rate adjustment of the triangular wave is performed by dividing into more voltage ranges. Therefore, it is possible to reduce an amount of over-compensation and under-compensation in compensating the frequency characteristic; accordingly, it is possible to realize the output load driving device which is excellent in the frequency response characteristic.

Also in Embodiment 2, the average slew rate (slew rate between the reference voltage VH and the reference voltage VL) of the triangular wave after the correction is the same as the slew rate of the triangular wave without the correction (the triangular wave with a waveform changing linearly), and the peak value of the triangular wave is also set as the same. The frequency of the PWM carrier after the correction is set as the same as the frequency of the PWM carrier before the correction.

Embodiment 3

Figure 15:
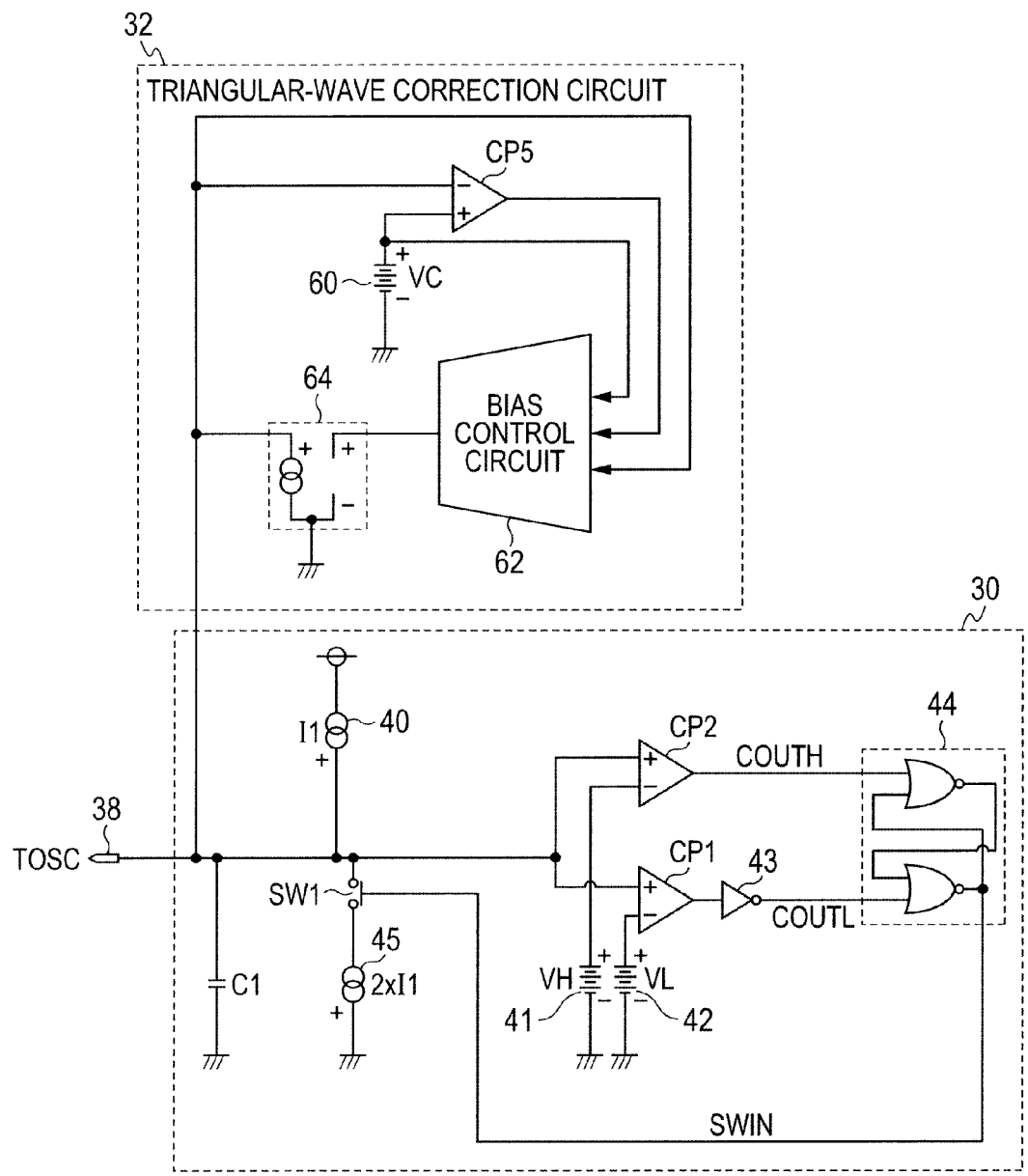
FIG. 15 is a drawing illustrating roughly an example of a triangular-wave signal generator and a triangular-wave correction circuit which are included in an output load driving device according to Embodiment 3 of the present invention.

FIG. 15 illustrates roughly configuration of a triangular-wave correction circuit 32 and a triangular-wave signal generator 30 according to Embodiment 3 of the present invention. The configuration of the triangular-wave signal generator 30 illustrated in FIG. 15 is the same as the configuration of the triangular-wave signal generator 30 according to Embodiments 1 and 2, therefore, the same reference number is given to a corresponding element, and the detailed explanation thereof is omitted.

The triangular-wave correction circuit 32 includes a reference voltage source 60 which generates a reference voltage VC; a comparator CP5 which compares the triangular-wave signal TOSC from the output node 38 and the reference voltage VC; a bias control circuit 62 which generates a bias signal corresponding to a difference of the reference voltage VC and a voltage level of the triangular-wave signal TOSC, according to an output signal of the comparator CP5; and a control current source 64 which generates a current proportional to a given voltage, according to the bias signal from the bias control circuit 62.

The comparator CP5 outputs a signal of H level, when the reference voltage VC is higher than the voltage level of the triangular-wave signal TOSC. The reference voltage VC corresponds to a voltage level of the central value of the wave height of the triangular-wave signal which the triangular-wave signal generator 30 generates.

The bias control circuit 62 performs voltage addition or voltage subtraction according to the output signal of the comparator CP5, and generates, as the bias signal, a voltage corresponding to the difference of the triangular-wave signal TOSC and the reference voltage VC.

The control current source 64 generates a charge current or a discharge current for the output node 38 according to an output signal of the bias control circuit 62. Specifically, the control current source 64 adjusts a charge and discharge current of the constant current source 40 corresponding to the bias signal voltage. Accordingly, a positive or a negative current corresponding to the difference of the triangular-wave signal TOSC and the reference voltage VC is supplied to the output node 38. A current corresponding to the level difference of the triangular-wave signal TOSC and the reference voltage VC is generated by the control current source 64, and the waveform of the triangular-wave signal TOSC can be adjusted continuously.

Figure 16:
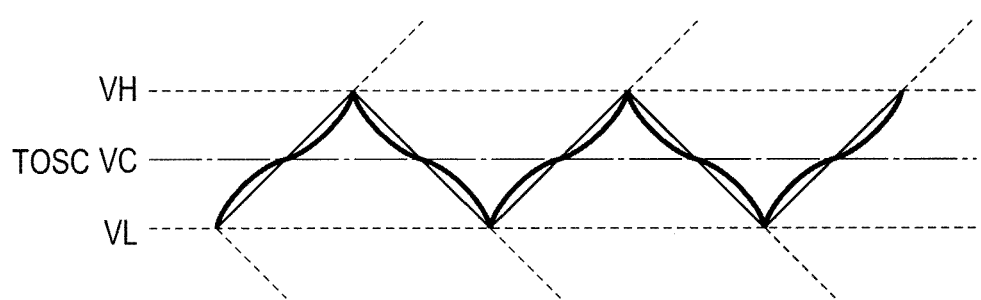
FIG. 16 is a signal waveform illustrating operation of the circuit illustrated in FIG. 15.

FIG. 16 is a timing chart illustrating correction operation of the triangular-wave by the triangular-wave signal generator 30 and the triangular-wave correction circuit 32 illustrated in FIG. 15. Hereafter, the operation of the triangular-wave signal generator 30 and the triangular-wave correction circuit 32 which are illustrated in FIG. 15 is explained with reference to FIG. 16.

As described above, the control current source 64 generates a current proportional to the output voltage of the bias control circuit 62. The bias control circuit 62 generates a bias signal voltage corresponding to a difference of the triangular-wave signal TOSC and the reference voltage VC. Corresponding to the bias signal voltage, the control current source 64 supplies a positive or a negative current to the output node 38. Therefore, as illustrated in FIG. 16, in an area near the center value of the triangular-wave signal TOSC (the center value being specified by the reference voltage VC), the current supplied by the control current source 64 becomes small, and correspondingly, the gradient of the triangular-wave signal TOSC becomes gentle. On the other hand, when a difference of the triangular-wave signal TOSC and the reference voltage VC becomes larger, the bias signal voltage become larger, and correspondingly, the control current source 64 supplies a larger positive or a larger negative current to the output node 38. Therefore, the slew rate of the triangular-wave signal TOSC can be changed continuously, and the frequency characteristic compensation can be performed more precisely.

Figure 17:
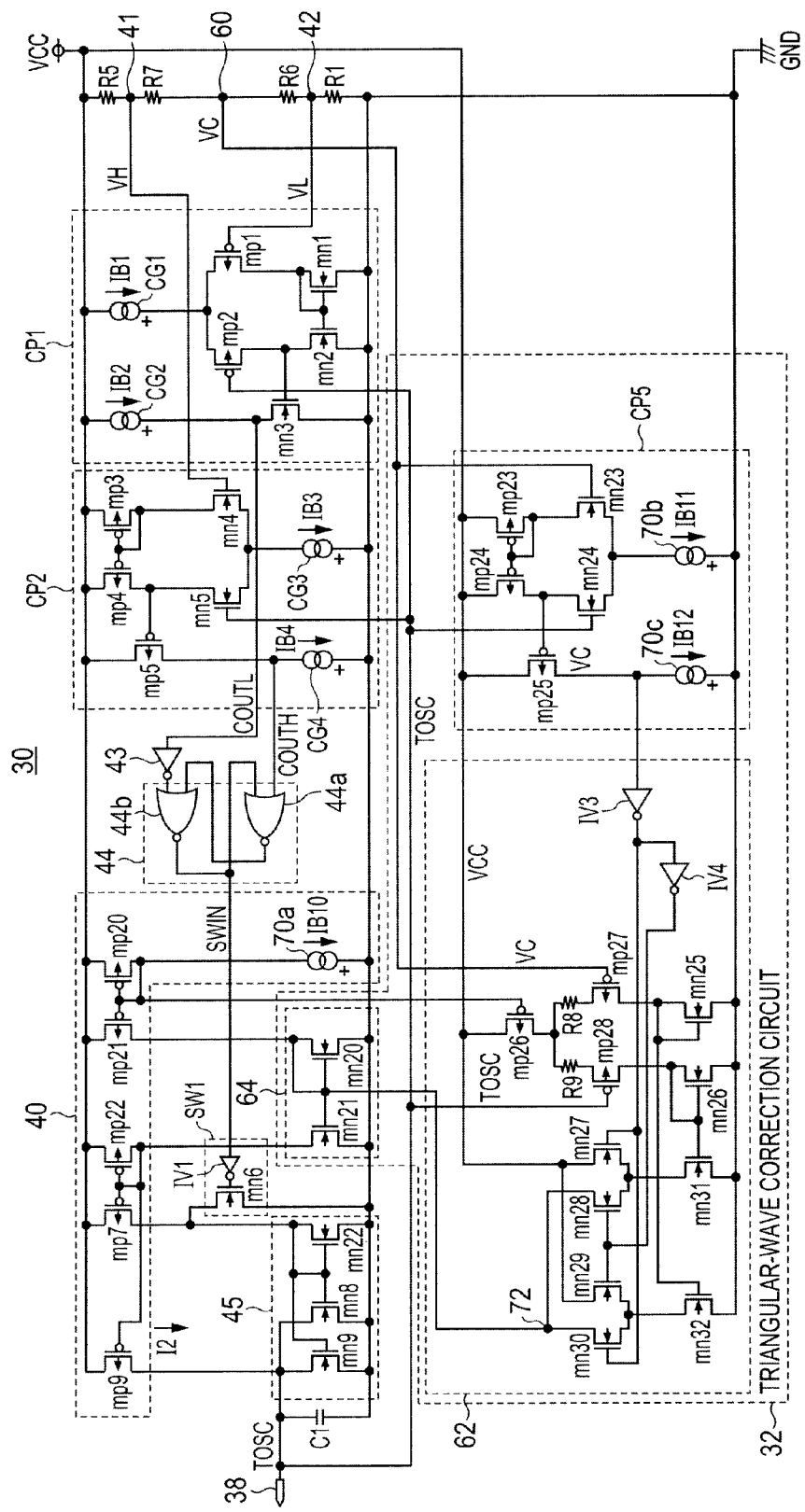
FIG. 17 is a drawing illustrating an example of a specific configuration of the circuit illustrated in FIG. 15.

(Specific configuration) FIG. 17 illustrates an example of specific configuration of the triangular-wave signal generator 30 and the triangular-wave correction circuit 32, illustrated in FIG. 15. In the configuration illustrated in FIG. 17, reference voltage sources 41, 42, and 60 are comprised of a resistive subdivision circuit of resistive elements R1, R6, R7, and R5. The resistive elements R1 and R5 correspond to the resistive elements R1 and R5 illustrated in FIG. 12. A connection node between the resistive element R1 and the resistive element R6 corresponds to the reference voltage source 42 to generate a reference voltage VL. A connection node between the resistive element R6 and the resistive element R7 corresponds to the reference voltage source 60 to generate a reference voltage VC. A connection node between the resistive element R7 and the resistive element R5 corresponds to the reference voltage source 41 to generate a reference voltage VH. By composing the reference voltage sources 41, 42, and 60 by one resistive subdivision circuit and by generating a reference voltage with the use of resistive subdivision of the power supply voltage VCC, it is possible to reduce the circuit layout area and to suppress change of the reference voltages VL, VC, and VH, generated by the reference voltage sources, due to change of the value of resistance of the resistive elements.

The triangular-wave signal generator 30 includes comparators CP1 and CP2; a flip-flop circuit 44; constant current sources 40 and 45; and a switching circuit SW1. The configuration of the comparators CP1 and CP2 of the present triangular-wave signal generator 30 is the same as the configuration illustrated in FIG. 12; therefore, the same reference number is given to a corresponding element, and the detailed explanation thereof is omitted.

When the voltage level of the triangular-wave signal TOSC is higher than the reference voltage VL, the comparator CP1 sets the output signal COUTL as H level. On the other hand, when the voltage level of the triangular-wave signal TOSC is lower than the reference voltage VL, the comparator CP1 sets the output signal COUTL as L level.

In the comparator CP2, when the voltage level of the triangular-wave signal TOSC becomes higher than the reference voltage VH, the output signal COUTH of the comparator CP2 turns to H level. When the voltage level of the triangular-wave signal TOSC is lower than the reference voltage VH, the output signal COUTH turns to L level.

Also in the configuration illustrated in FIG. 17, the flip-flop circuit 44 includes NOR gates 44a and 44b, same as in the configuration illustrated in FIG. 12. An inverter 43 is provided in the preceding stage of the NOR gate 44b of the flip-flop circuit 44 in order to reverse the output signal COUTL of the comparator CP1. In the configuration illustrated in FIG. 17, the flip-flop circuit 44 is comprised of NOR gates. However, the flip-flop circuit 44 can be realized similarly, even when NAND gates are used. The configuration and the operation of the flip-flop circuit 44 are the same as those of the flip-flop circuit 44 illustrated in FIG. 12. Therefore, the detailed explanation of the configuration and operation thereof is omitted, and the brief explanation of the operation will be made in the following.

In the flip-flop circuit 44, when the output signal COUTL of the comparison circuit CP1 turns to L level (i.e., when the triangular-wave signal TOSC reaches the reference voltage VL), the switching control signal SWIN turns to L level. On the other hand, when the triangular-wave signal TOSC reaches the reference voltage VH, the switching control signal SWIN turns to H level. When the triangular-wave signal TOSC is between the reference voltage VH and the reference voltage VL, the flip-flop circuit 44 is maintained in a set state or a reset state, and the switching control signal SWIN maintains the previous logic state.

The constant current source 40 includes P-channel MOS transistors mp20 and mp21 which form a current mirror stage; P-channel MOS transistor mp22, mp7, and mp9 which form a current mirror stage; and a constant current source 70a. The MOS transistor mp20 has a gate and a drain which are intercoupled with each other, and functions as a master of a the current mirror stage. The gate and the drain of the MOS transistor mp20 are coupled to the constant current source 70a, and a mirror current of a constant current IB10 supplied by the constant current source 70a flows through the MOS transistor mp21.

The MOS transistor mp22 has a gate and a drain which are intercoupled with each other, and a mirror current of a current which flows through the MOS transistor mp22 flows through the MOS transistors mp7 and mp9. The amount of current which flows through the MOS transistor mp22 is adjusted by the control current source 64.

The constant current source 45 includes N-channel MOS transistors mn22, mn8, and mn9 which form a current mirror stage. The MOS transistor mn22 has a gate and a drain which are intercoupled with each other and receive a current supplied by the MOS transistor mp7. Each of the MOS transistors mn8 and mn9 has the same size as the MOS transistor mp9, and these MOS transistors mn8 and mn9 can pass twice as many current as the current which the MOS transistor mp9 passes.

The switching circuit SW1 includes an inverter IV1 and an N-channel MOS transistor mn6, same as in the configuration illustrated in FIG. 12. In the switching circuit SW1, when the switching control signal SWIN is L level (i.e., when the triangular-wave signal TOSC reaches the reference voltage VL), the MOS transistor mn6 turns to ON state, and the switching circuit SW1 becomes in a non-conductive state equivalently. In the present state, the gates of the MOS transistor mn22, mn8, and mn9 of the current source 45 are driven to the ground voltage GND level, and the MOS transistor mn22, mn8, and mn9 become in OFF state, accordingly discharge operation of the constant current source 45 stops.

On the other hand, when the switching control signal SWIN from the flip-flop circuit 44 turns to H level (i.e., when the triangular-wave signal TOSC reaches the reference voltage VH), the MOS transistor mn6 becomes in OFF state, and the switching circuit SW1 becomes in a conductive state equivalently. In the present state, twice as many current (2·I2) as the mirror current of the current (I2) supplied from the MOS transistor mp7 is discharged from the output node 38 by the MOS transistors mn8 and mn9. On the other hand, the current I2 is supplied from the constant current source 40 to the output node 38. Therefore, the output node 38 (capacitive element C1) is discharged by the current I2.

In the triangular-wave correction circuit 32, the comparator CP5 has the same logic and function of input-output as the comparator CP5 illustrated in FIG. 16. The comparator CP5 includes P-channel MOS transistors mp23 and mp24 which are coupled to the power node and form a current mirror stage; N-channel MOS transistors mn23 and mn24 which form a differential stage for comparing the triangular-wave signal TOSC with the reference voltage VC; a constant current sources 70b and 70c; and a P-channel MOS transistor mp25 which supplies a current to the constant current source 70c selectively from the power node, corresponding to the drain voltage of the MOS transistors mp24 and mn24.

The MOS transistor mp23 has a gate and a drain which are intercoupled with each other, and functions as a master of a current mirror stage, and a mirror current of the current which flows through the MOS transistor mp23 flows through the MOS transistor mp24. The MOS transistor mn23 receives the reference voltage VC at the gate thereof, and the MOS transistor mn24 receives the triangular-wave signal TOSC at the gate thereof. The constant current source 70b is coupled between the ground node and a common source node of the MOS transistors mn23 and mn24, and supplies a constant current IB11. The constant current source 70c is coupled between the MOS transistor mp25 and the ground node, and supplies a constant current IB12.

In the comparator CP5, when the triangular-wave signal TOSC is lower than the reference voltage VC, conductance of the MOS transistor mn23 becomes greater than conductance of the MOS transistor mn24. Correspondingly, a current which flows through the MOS transistor mn24 becomes smaller than the mirror current of a current which flows through the MOS transistor mp23, and the gate voltage of the MOS transistor mp25 rises. Accordingly the current which flows through the MOS transistor mp25 becomes smaller than the constant current IB12 which the constant current source 70c drives, and the output signal of the comparator CP5 turns to L level.

On the other hand, when the triangular-wave signal TOSC becomes higher than the reference voltage VC, the conductance of the MOS transistor mn23 becomes smaller than the conductance of the MOS transistor mn24, and the MOS transistor mn24 discharges a current greater than the mirror current of the current which flows through the MOS transistor mp23, accordingly, the gate voltage of the MOS transistor mp25 turns to L level, and the MOS transistor mp25 becomes in ON state. Correspondingly, a current greater than the constant current IB12 is supplied to the constant current source 70c, and the output signal of the comparator CP5 turns to H level.

The bias control circuit 62 includes an inverter IV3 which receives the output signal of the comparator CP5; an inverter IV4 which receives the output signal of the inverter IV3; a P-channel MOS transistor mp26 which functions as a constant current source; resistive elements R8 and R9; and P-channel MOS transistors mp27 and mp28 which form a differential stage for comparing the triangular-wave signal TOSC with the reference voltage VC.

The MOS transistor mp26 is coupled at the gate thereof to the MOS transistor mp20 included in the constant current source 40, and passes a mirror current of the current (IB10) which flows through the MOS transistor mp20.

The resistive elements R8 and R9 are coupled in parallel to a drain of the MOS transistor mp26, and perform current-voltage conversion, causing a source voltage of the MOS transistors mp28 and mp27 to drop.

The MOS transistor mp27 is coupled to the resistive element R8 at the source thereof, and receives the reference voltage VC at the gate thereof. The MOS transistor mp28 is coupled to the resistive element R9 at the source thereof, and receives the triangular-wave signal TOSC at the gate thereof.

The bias control circuit 62 includes further an N-channel MOS transistor mn25 coupled between the MOS transistor mp27 and the ground node; and an N-channel MOS transistor mn26 coupled between the MOS transistor mp28 and the ground node. Each of the MOS transistors mn25 and mn26 has a gate and a drain which are intercoupled with each other.

The bias control circuit 62 includes further N-channel MOS transistors mn27-mn32 for controlling an amount of current which flows through an internal node 72. The MOS transistors mn27 and mn30 receive the output signal of the inverter IV3 at the gate thereof, and pass a current from the power node and a current from the internal output node 72, respectively. The MOS transistors mp28 and mn29 receive the output signal of the inverter IV4 at the gate thereof, and pass a current from the internal node 72 and a current from the power node, respectively.

The MOS transistor mn31 is coupled between the ground node and a common source node of the MOS transistors mn27 and mn28, and the gate thereof is coupled to a gate of the MOS transistor mn26. The MOS transistor mn32 is coupled between the ground node and a common source node of the MOS transistors mn29 and mn30, and the gate thereof is coupled to a gate of the MOS transistor mn25.

Therefore, the MOS transistors mn26 and mn31 form a current mirror circuit, and the MOS transistors mn25 and mn32 form a current mirror circuit. A mirror current of a current which flows through the MOS transistor mn25 flows through the MOS transistor mn32. A mirror current of a current which flows through the MOS transistor mn26 flows through the MOS transistor mn31.

When the triangular-wave signal TOSC is lower than the reference voltage VC, the output signal of the comparator CP5 is L level. Therefore, the output signal of the inverter IV3 turns to H level and the output signal of the inverter IV4 turns to L level. In this state, the MOS transistors mn27 and mn30 turn to ON state, and the MOS transistors mn28 and mn29 turn to OFF state. Since the voltage level of the triangular-wave signal TOSC is lower than the reference voltage VC, a current which flows through the MOS transistor mp28 becomes greater than a current which flows through the MOS transistor mp27. At this time, the current greater than the current which flows through the resistive element R8 flows through the resistive element R9, and the source voltage of the MOS transistor mp28 is reduced, suppressing an amount of current which flows through the MOS transistor mp28.

Currents which flow through the MOS transistors mp27 and mp28 are supplied to the MOS transistors mn25 and mn26, respectively. The mirror currents of the currents which flow through the MOS transistors mp28 and mp27 flow through the MOS transistors mn31 and mn32, respectively. Therefore, the amount of current which flows through the MOS transistor mn31 becomes greater than the current which flows through the MOS transistor mn32. At this time, the MOS transistors mp27 and mn30 are in ON state. Therefore, the mirror current of the current which flows through the MOS transistor mp27 flows from the internal node 72 to the ground node through the MOS transistor mn30. On the other hand, the mirror current of the current which flows through MOS transistor mp28 flows from the power node VCC through the MOS transistor mn27. In the present case, a current which decreases corresponding to the difference of the triangular-wave signal TOSC and the reference voltage VC flows from the internal node 72 to the ground node, on the basis of the voltage level when the triangular-wave signal TOSC is equal to the reference voltage VC. The current which flows through the internal node 72 becomes small as the difference of the triangular-wave signal TOSC and the reference voltage VC becomes large.

On the other hand, when the output signal of the comparator CP5 is H level and the triangular-wave signal TOSC is higher than the reference voltage VC, the output signal of the inverter IV3 turns to L level and the output signal of the inverter IV4 turns to H level. In this state, the MOS transistors mp27 and mn30 turn to OFF state, and the MOS transistors mn28 and mn29 turn to ON state. In this state, the mirror currents of the currents which flow through the MOS transistors mp27 and mn25 are drawn out from the internal node 72 by the MOS transistors mn28 and mn31. On the other hand, the mirror currents of the currents which flow through the MOS transistors mn25 and mp27 are drawn out from the power node by the MOS transistors mn29 and mn32. Since the triangular-wave signal TOSC is higher than the reference voltage VC, the current which flows through the MOS transistor mn25 becomes greater than the current which flows through the MOS transistor mn26. Also in this state, a current which decreases gradually corresponding to the difference of the triangular-wave signal TOSC and the reference voltage VC flows from the internal node 72.

That is, when the triangular-wave signal TOSC is lower than the reference voltage VC, a current which decreases corresponding to the voltage difference of (VC-TOSC) flows through the internal node 72, and when the triangular-wave signal TOSC is higher than the reference voltage VC, on the other hand, a current which decreases corresponding to the voltage difference of (TOSC-VC) flows through the internal node 72. When the triangular-wave signal TOSC and the reference voltage VC are equal, a current Ir of the same magnitude flows through each of the MOS transistors mp27 and mp28. With the assumption that the current Ir in the present case is a reference current, a current which becomes smaller than the reference current Ir, corresponding to the absolute value of the voltage difference |VC-TOSC|, flows through the internal node 72.

The present reference current Ir is the mirror current of the constant current IB10. The sum total of currents which flow through the MOS transistors mp27 and mp28 is equal to the mirror current of the constant current IB10. Therefore, the current which flows through the internal node 72 becomes smaller than the reference current Ir as the difference of the triangular-wave signal TOSC and the reference voltage VC becomes larger. A current drawn out from the power node increases from the reference current Ir toward the mirror current of the constant current IB10.

The control current source 64 includes N-channel MOS transistors mn20 and mn21 of which the gates are coupled to the internal node 72 of the bias control circuit 62, and which form a current mirror stage. The MOS transistor mn20 is coupled between the MOS transistor mp21 and the ground node, and the gate and the drain thereof are intercoupled with each other. The MOS transistor mn21 is coupled between the MOS transistor mp22 and the ground node. A mirror current of a current which flows through the MOS transistor mn20 flows through the MOS transistor mn21.

The current supplied by the MOS transistor mp21 (the mirror current of the constant current IB10) is supplied to the MOS transistor mn20 and the internal node 72. A current drawn out from the internal output node 72 is the mirror current of the smaller one of the current which flows through the MOS transistor mp28 and the current which flows through the MOS transistor mp27. When the difference of the triangular-wave signal TOSC and the reference voltage VC is small, the difference in amount of the current which flows through the MOS transistor mp27 and the current which flows through the MOS transistor mp28 is small. At this time, a current, which is somewhat smaller than the reference current Ir at the time when the triangular-wave signal TOSC and the reference voltage VC are equal, flows through the internal node 72.

The amount of current which flows through the MOS transistor mn20 becomes somewhat larger compared with a state where the triangular-wave signal TOSC and the reference voltage VC are equal, correspondingly, the amount of current which flows through the MOS transistor mn21 also becomes somewhat larger. Therefore, the amount of current which flows through each of the MOS transistors mp22, mp7, and mp9 also becomes somewhat larger.

On the other hand, when the difference of the triangular-wave signal TOSC and the reference voltage VC are large, a current drawn out from the internal node 72 decreases greatly, and an amount of current which flows through the MOS transistor mn20 increases greatly; correspondingly, an amount of current which flows through each of the MOS transistors mp22, and mp7 and mp9 increases.

At the time of charging of the output node 38, the current I2 is supplied through the MOS transistor mp9. The current I2 is the mirror current of a current which flows through each of the MOS transistors mp22, mn21, and mn20. At this time, the MOS transistors mpg and mp7 have the same size (the ratio of the gate width to the gate length is same), and pass a current of the same magnitude. Therefore, the charge current I2 becomes larger as the difference of the triangular-wave signal TOSC and the reference voltage VC becomes larger, and becomes smaller as the difference becomes smaller. Therefore, the slew rate at the time of rising of the triangular-wave signal TOSC becomes larger as the difference with the reference voltage VC becomes larger, and the slew rate becomes the smallest when the triangular-wave signal TOSC and the reference voltage VC are equal in level.

At the time of discharging of the output node 38, a current 2·I2 which is twice as many as the current flowing through the MOS transistor mp7 flows through the MOS transistors mn8 and mn9. Therefore, the charge current and the discharge current of the capacitive element C1 coupled to the output node 38 have the same profile. Thereby, corresponding to the difference of the triangular-wave signal TOSC and the reference voltage VC, the slew rate of the triangular-wave signal TOSC can be adjusted continuously.

As described above, according to Embodiment 3 of the present invention, the slew rate of the triangular-wave signal is adjusted continuously, corresponding to the difference of the triangular-wave signal TOSC and the reference voltage VC. Accordingly, it is possible to perform the slew rate adjustment and the gain compensation with a high degree of precision. Correspondingly, it is possible to adjust the frequency characteristic more precisely.

In particular, in the bias control circuit 62, the MOS transistor mp26 forms a current mirror circuit with the MOS transistor mp20 of the constant current source. Accordingly, it is possible to precisely change the current which flows through the MOS transistors mp27 and mp28, to a current level corresponding to the difference of the triangular-wave signal TOSC and the reference voltage VC, on the basis of the current (IB10/2) which is one half the constant current IB10. Thereby, the average slew rate of the triangular-wave signal can be set up the same as the slew rate of the triangular-wave signal in the case of no correction.

Embodiment 4

Figure 18:
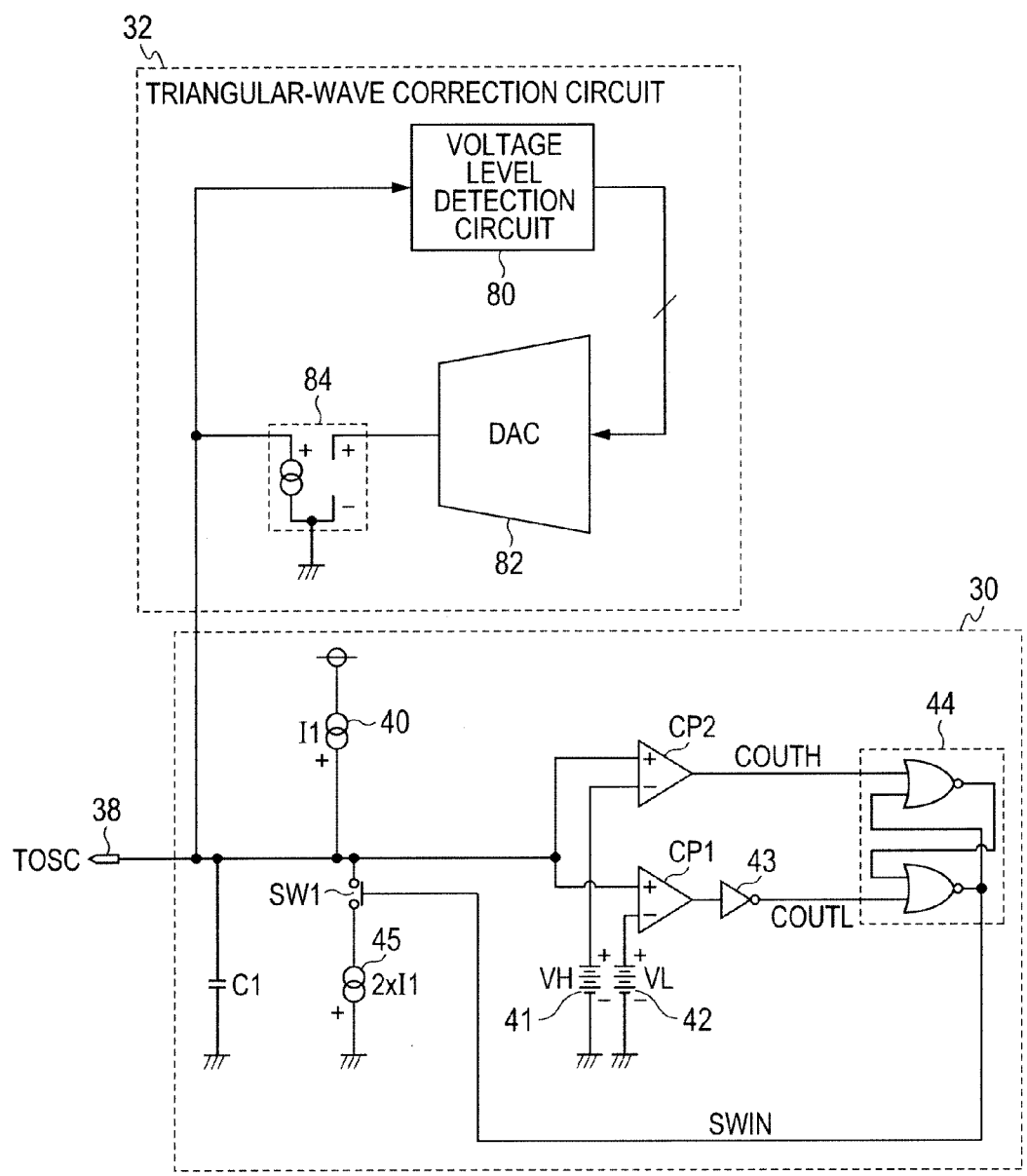
FIG. 18 is a drawing illustrating roughly configuration of a triangular-wave signal generator and a triangular-wave correction circuit according to Embodiment 4 of the present invention.

FIG. 18 illustrates configuration of a triangular-wave correction circuit according to Embodiment 4 of the present invention with configuration of a triangular-wave signal generator 30. The configuration of the triangular-wave signal generator 30 illustrated in FIG. 18 is the same as illustrated in Embodiment 1-Embodiment 3, therefore, the same reference number is given to a corresponding element, and the detailed explanation thereof is omitted.

The triangular-wave correction circuit 32 includes a voltage level detection circuit 80 which detects a voltage level of the triangular-wave signal TOSC at the output node 38; a digital-to-analog converter (DAC) 82 which converts into an analog signal a digital code signal outputted by the voltage level detection circuit 80; and a control current source 84 which adjusts a charge and discharge current for the output node 38, according to the output signal of the DAC 82.

The voltage level detection circuit 80 detects a voltage level of the triangular-wave signal TOSC, and generates a multi-bit digital code which indicates the detected voltage level. The DAC 82 converts the multi-bit digital code from the voltage level detection circuit 80 again into an analog signal, and controls the charge and discharge current of the control current source 84. Thereby, the slew rate of the triangular-wave signal TOSC can be discretely adjusted over two or more steps.

Figure 19:
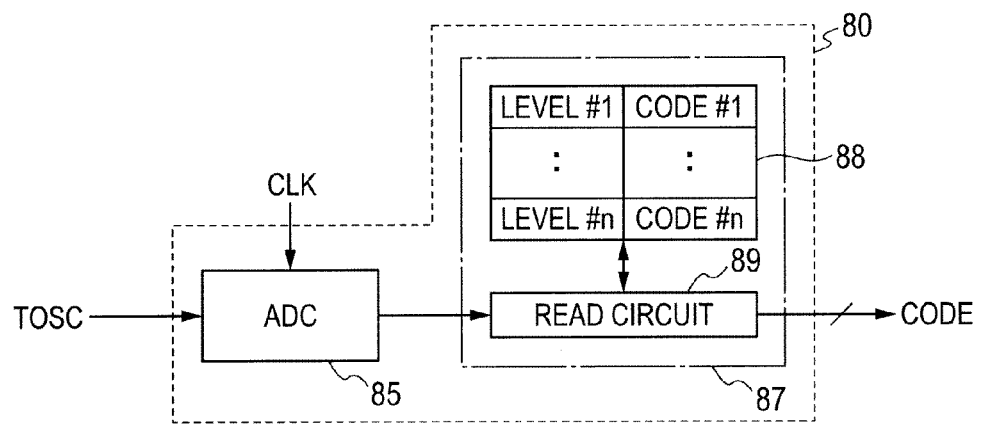
FIG. 19 is a drawing illustrating roughly an example of configuration of a voltage level detection circuit illustrated in FIG. 18.

FIG. 19 illustrates roughly an example of configuration of the voltage level detection circuit 80 illustrated in FIG. 18. In FIG. 19, the voltage level detection circuit 80 includes an analog-to-digital converter (ADC) 85 which converts the triangular-wave signal TOSC into a digital signal; and a table memory circuit 87 which reads a corresponding control code according to the digital signal outputted by the ADC 85, and generates a control code CODE.

In the table memory circuit 87, a table memory 88 and a read circuit 89 are provided. In the table memory circuit 87, a peak value (VH–VL) of the triangular-wave signal TOSC is divided into n voltage levels, and an entry is provided corresponding to each of the voltage levels. In each entry, Code #1-Code #n for specifying an amount of supply current are stored, linking to Level #1-Level #n of voltage of the triangular-wave signal TOSC, respectively. The read circuit 89 refers to the corresponding entry of the table memory 88 according to the digital signal from the ADC 85, reads a code stored there after linking, and generates a control code CODE.

The DAC 82 converts the control code CODE into an analog signal again. As the configuration of the control current source 84, an output signal of the DAC 84 is supplied to the gate of the MOS transistor mn21 (included in the control current source 64) via a capacitive element, in the configuration illustrated in FIG. 17, for example.

Thereby, when the difference of the triangular-wave signal TOSC and the reference voltage VC is small, a current supplied by the constant current sources 40 and 45 (in FIG. 17) is reduced (by lowing a bias of the gate voltage of the MOS transistors mn20 and mn21), and when the difference of the triangular-wave signal TOSC and the reference voltage VC becomes large, a current supplied by the constant current sources 40 and 45 is increased (by raising the bias voltage of the gate voltage of the MOS transistors mn20 and mn21). Accordingly, it is possible to adjust the slew rate of the triangular-wave signal TOSC at the optimal voltage level over multi voltage levels. Therefore, an amount of over-compensation and an amount of under-compensation can be reduced, and a frequency variation range can be minimized.

To the ADC 85 illustrated in FIG. 19, a sampling cycle for performing the analog-to-digital conversion is specified by a clock signal CLK. Therefore, it is necessary to make the frequency of the clock signal CLK higher enough than the frequency of the triangular-wave signal TOSC, i.e., the frequency of a PWM carrier.

As described above, according to Embodiment 4 of the present invention, after sampling the triangular-wave signal and converting the voltage level into a digital signal, a control code is generated and a charge and discharge current of the output node is adjusted according to the control code. Thereby, an amount of over-compensation and an amount of under-compensation can be reduced, and the frequency variation range can be made small. The amount of compensation can be further adjusted by changing the control code of the table memory circuit 87 illustrated in FIG. 19.

Embodiment 5

Figure 20:
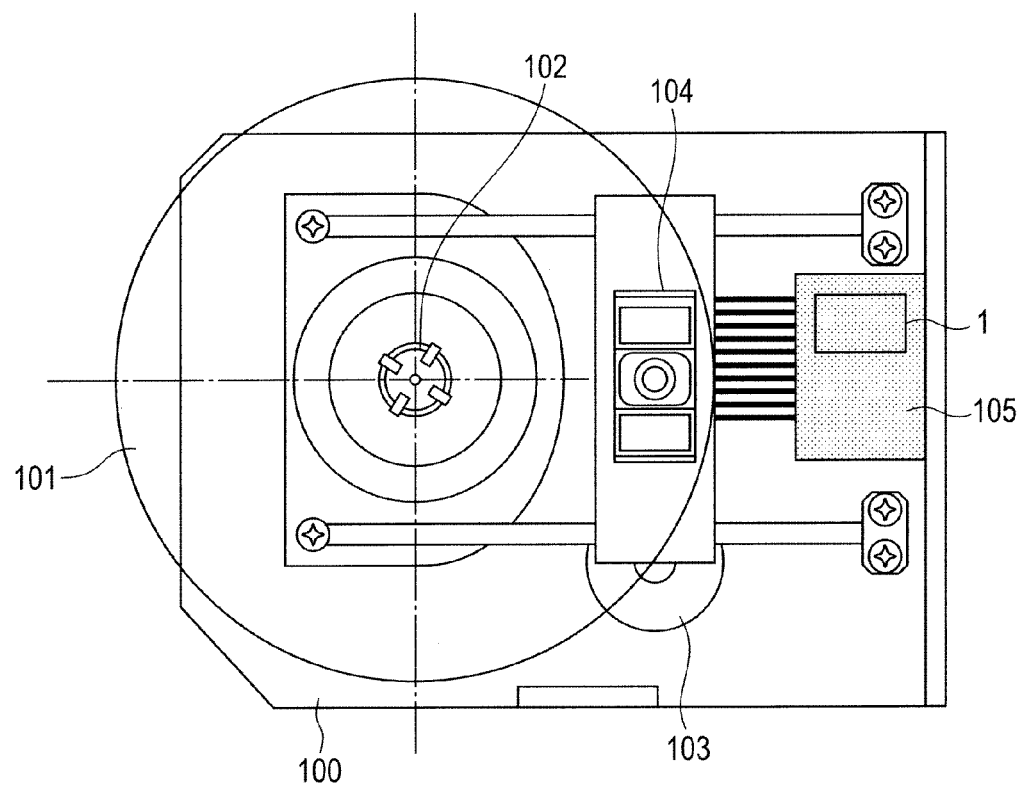
FIG. 20 is a drawing illustrating roughly entire configuration of an optical disk storage device which includes an output load driving device according to the present invention.

FIG. 20 illustrates roughly entire configuration of an optical disk storage device according to Embodiment 5 of the present invention. In the present optical disk storage device, the output load driving device including the class D amplifier circuit according to the embodiments which have been explained in the above is utilized as a circuit apparatus for driving an actuator or a motor.

In FIG. 20, the optical disk storage device includes a main body 100 of the optical disk storage device. The main body 100 of the optical disk storage device is provided with a spindle motor 102 for rotating an optical disk 101; an optical pickup unit 104 for reading information stored in the optical disk 101 and for writing information into the optical disk 101; a slide motor 103 for moving the optical pickup unit 104 in the radial direction of the optical disk; and a motor/actuator driving circuit substrate 105 in which a motor drive IC (integrated circuit device) for driving the spindle motor 102, the actuator, and the slide motor 103 is mounted. On the motor/actuator driving circuit substrate 105, the output load driving device 1 according to the present invention is arranged.

FIG. 21 (A) is a top view of the optical pickup unit 104 illustrated in FIG. 20. FIG. 21 (B) is a side view of the optical pickup unit 104 illustrated in FIG. 20. As illustrated in FIG. 21 (A), in the optical pickup unit 104, magnets 201 and 204 are arranged on both sides, facing each other, and an objective lens 203 is arranged in the central part. The objective lens 203 is held by support wires 202. Facing the magnet 201, an actuator coil 205a is arranged, and facing the magnet 204, an actuator coil 205b is arranged. An actuator coil 205c is arranged inside the actuator coils 205a and 205b, surrounding the objective lens 203.

As illustrated in FIG. 21 (B), the actuator coil 205c is arranged surrounding the objective lens 203, and the actuator coils 205a and 205b are arranged at both sides thereof. The objective lens 203 is held by the plural support wires 202 which are engaged to a supporter of the optical pickup unit 104.

The actuator coil 205c serves as a focus actuator coil for moving the objective lens 203 in the focus direction with respect to a recording surface of the optical disk 101. A pair of group of the actuator coils 205a and 205b serves as an actuator coil for tilt control which adjusts an angle of a focal axis of the objective lens 203 with respect to the recording surface of the optical disk 101. The other group of the actuator coils serves as a tracking actuator coil for moving the objective lens 203 in the radial direction of the optical disk 101. Three kinds of actuators for focusing, tracking, and tilting serve as driving equipment for maintaining the focus of the objective lens in the optimal state with respect to the recording surface of the optical disk, and they operates in synchronization with the rotation of the optical disk.

When the density of data of read/write to the optical disk recording surface is higher, the focus of the objective lens 203 needs to follow at higher speed, in the case of a constant rotational speed. As an optical disk, a BD optical disk (a blue-ray disk) has begun to be used instead of a DVD optical disk now. The BD optical disk has amount of information of a recording surface about five or more times compared with the DVD optical disk, and the BD optical disk needs to perform a high-precision focus control.

In order to drive the actuator, an error signal for servo control is utilized as an input signal. That is, when performing control of tracking, tilting, and focusing, an input signal (VIN) is generated by the servo control based on an error of an actual measurement to an expectation value. When a highly-precise focusing is performed, the input signal needs to change at high speed, and needs to utilize drive equipment excellent in a frequency characteristic. As the drive equipment for driving the present actuators, the output load driving device according to the present invention is applied. By applying the output load driving device, it is possible to realize a highly-efficient optical disk storage device which can read recorded information of BD precisely and which can write recording information at high density with a high degree of accuracy.

The present invention is applicable to a semiconductor circuit device which has a drive circuit for driving an actuator or a motor, and also applicable to a circuit for performing a high-speed control of a drive circuit which has configuration of a full bridge connection or half bridge connection and which has a voltage-feedback class-D amplifier circuit with a function to perform a PWM conversion using a triangular-wave signal.

The output load described above is not limited to an actuator and a spindle motor, but a solenoid, a DC motor (a direct-current motor), a VCM motor (a voice coil motor), a piezo-electric element, a speaker, or a stepping motor can be equally utilized.

As described above, according to Embodiment 5 of the present invention, the output load driving device which is excellent in the frequency characteristic is utilized for the actuator drive of the optical disk storage device, accordingly, it is possible to perform a highly-precise focus servo control to an optical disk like a BD optical disk in which high-density information is recorded.

By applying the output load driving device according the present invention to a semiconductor circuit device having a class D amplifier circuit which performs a PWM conversion using a triangular wave as described above, an output load driving device excellent in the frequency characteristic can be realized.

In addition to the output load driving device, the present output load driving device can be applied to a circuit which performs PWM modulation of an input signal using a triangular-wave signal. In that case, it is possible to generate a signal to which a precise PWM conversion is performed even when a small amplitude signal is inputted.

What is claimed is:

1. An amplifier circuit comprising:
   a first output node and second output node which drive an output load external to the amplifier;
   a first smoothing circuit which smoothes a signal at the first output node;
   a second smoothing circuit which smoothes a signal at the second output node;

a first error amplification circuit which generates a signal indicative of difference of the output signal of the first smoothing circuit and an externally-supplied signal corresponding to an input signal;

a second error amplification circuit which generates a signal indicative of difference of the output signal of the second smoothing circuit and the externally-supplied signal corresponding to the input signal;

a triangular-wave generation circuit which generates a triangular-wave signal with a gradient;

a triangular-wave correction circuit which receives the triangular-wave signal, controls the gradient of the triangular-wave signal according to the voltage level of the triangular-wave signal and outputs a corrected triangular-wave signal;

a first comparison circuit which compares the corrected triangular-wave signal with the output signal of the first error amplification circuit, and outputs a signal corresponding to the comparison result;

a second comparison circuit which compares the corrected triangular-wave signal with the output signal of the second error amplification circuit, and outputs a signal corresponding to the comparison result;

a first output circuit which performs charge and discharge to the first output node according to the output signal of the first comparison circuit; and a second output circuit which performs charge and discharge to the second output node according to the output signal of the second comparison circuit.

2. The amplifier according to claim 1, wherein the triangular-wave correction circuit reduces the slew rate of the triangular-wave signal in an area where a duty of the output signal of the first comparison circuit and a duty of the output signal of the second comparison circuit become about 50%.

* * * * *